United States Patent
Shimizu et al.

[19]

[11] Patent Number: 6,097,622

[45] Date of Patent: *Aug. 1, 2000

[54] FERROELECTRIC MEMORY USED FOR THE RFID SYSTEM, METHOD FOR DRIVING THE SAME, SEMICONDUCTOR CHIP AND ID CARD

[75] Inventors: Mitsuru Shimizu; Hiroyuki Takenaka, both of Kanagawa-ken; Sumio Tanaka, Tokyo, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/867,792

[22] Filed: Jun. 3, 1997

[30] Foreign Application Priority Data

| Jun. 3, 1996 | [JP] | Japan | 08-139846 |
| Jul. 12, 1996 | [JP] | Japan | 08-201042 |
| Jul. 12, 1996 | [JP] | Japan | 08-201043 |
| Aug. 14, 1996 | [JP] | Japan | 08-231265 |
| Dec. 9, 1996 | [JP] | Japan | 08-328333 |
| Dec. 9, 1996 | [JP] | Japan | 08-328334 |
| Mar. 10, 1997 | [JP] | Japan | 09-054989 |

[51] Int. Cl.$^7$ ................................. G11C 11/22

[52] U.S. Cl. ........................... 365/145; 365/149; 365/210

[58] Field of Search .................................. 365/145, 149, 365/210

[56] References Cited

U.S. PATENT DOCUMENTS

| 4,873,664 | 10/1989 | Eaton, Jr. ................................. 365/145 |
| 5,479,172 | 12/1995 | Smith et al. ............................... 342/51 |
| 5,487,032 | 1/1996 | Mihara et al. ........................... 365/145 |
| 5,517,445 | 5/1996 | Imai et al. ............................... 365/145 |
| 5,608,667 | 3/1997 | Osawa ..................................... 365/145 |
| 5,629,888 | 5/1997 | Saito et al. ............................. 365/145 |

*Primary Examiner*—David Nelms
*Assistant Examiner*—Hien Nguyen
*Attorney, Agent, or Firm*—Oblon, Spivak, McClelland, Maier & Neustadt, P.C.

[57] ABSTRACT

A ferroelectric memory having a memory cell array or a plurality of memory cell arrays, word lines, where each memory cell array includes word lines. The memory also includes a plurality of plate lines, where each memory cell array includes some of the plate lines and the word line corresponds with some of the plate lines, a bit line, a word line select circuit for selecting among the word lines, and plurality of plate line select circuits, where each of the plate line select circuit is coupled to an associated plate line.

22 Claims, 28 Drawing Sheets

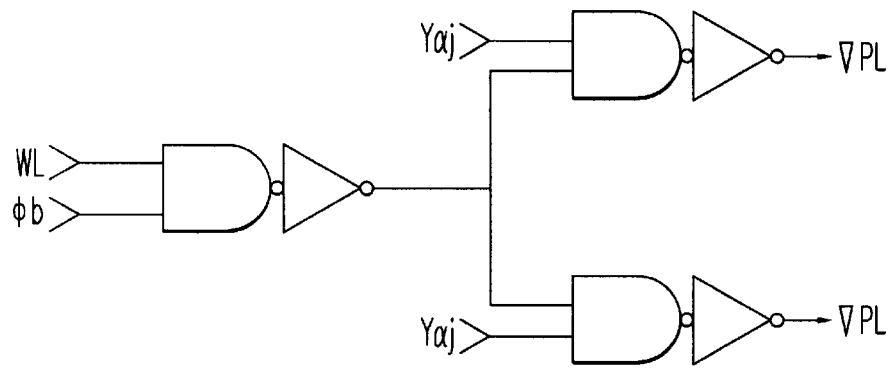
FIG. 14
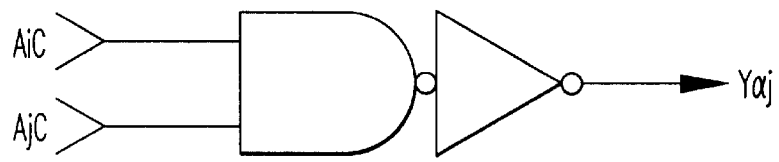
FIG. 15A
|   | AiC | AjC | Yαj |
|---|-----|-----|-----|
| 1 | AiC | AjC | Yα0 |
| 2 | AiC | $\overline{AjC}$ | Yα1 |
| 3 | $\overline{AiC}$ | AjC | Yα2 |
| 4 | $\overline{AiC}$ | $\overline{AjC}$ | Yα3 |
FIG. 15B

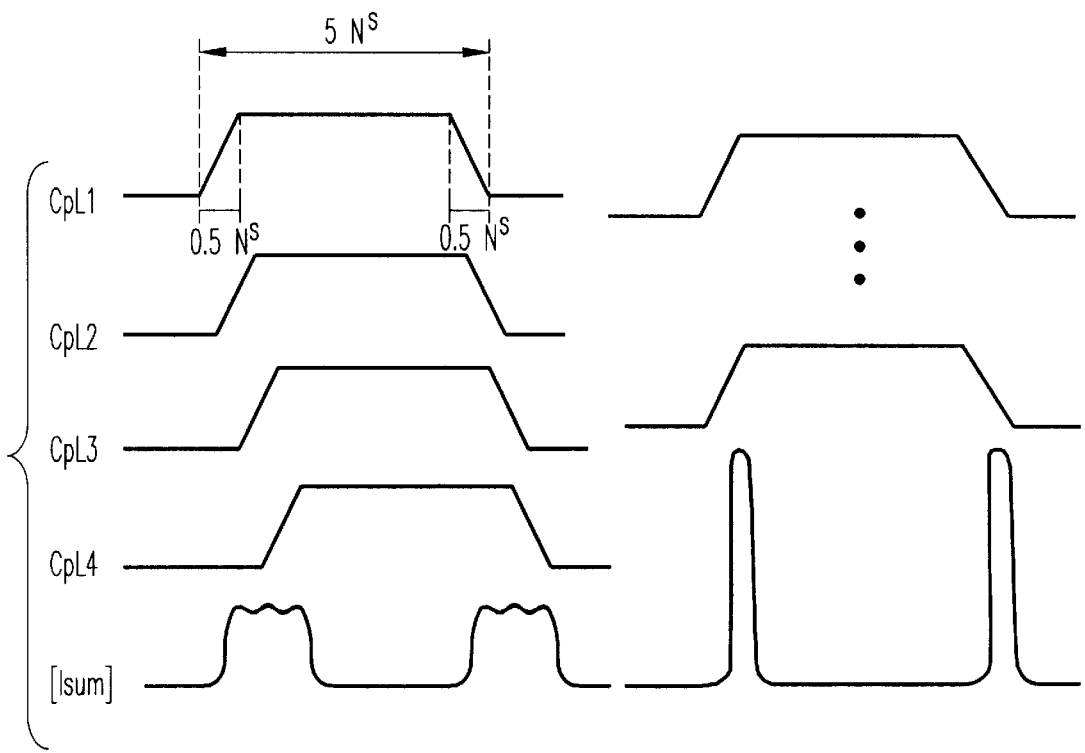
*FIG. 20A*  *FIG. 20B*
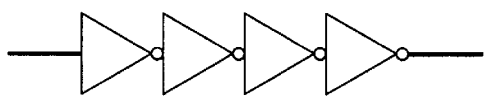
*FIG. 21A*
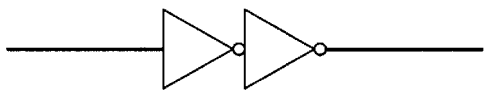
*FIG. 21B*
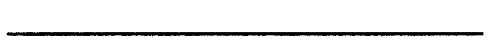
*FIG. 21C*

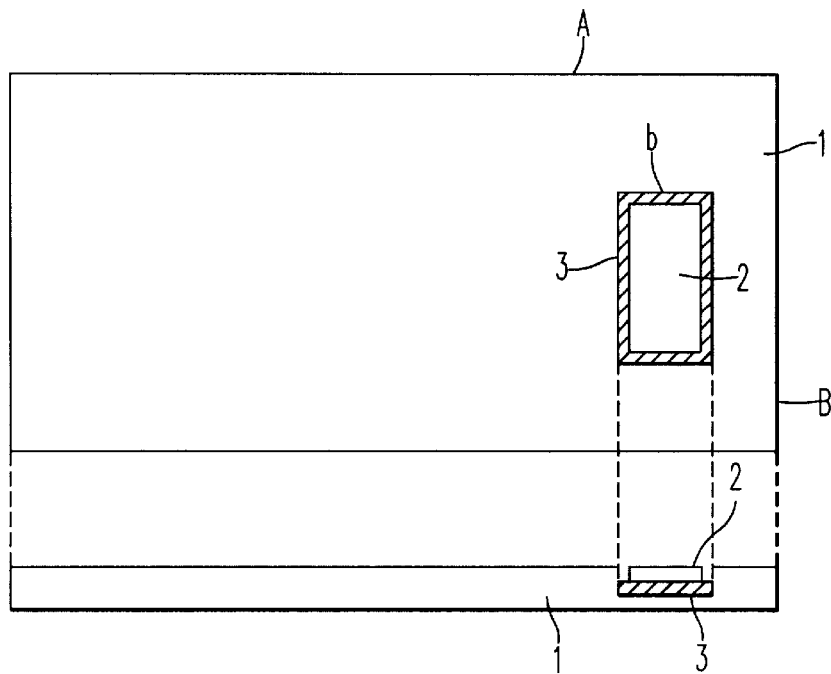
FIG. 35A
FIG. 35B
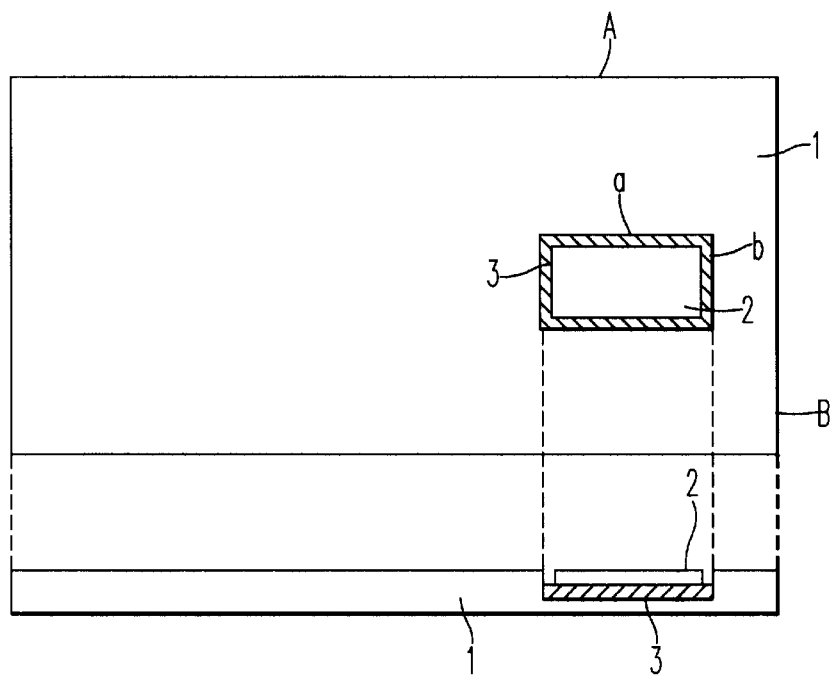
FIG. 36A
FIG. 36B

| NAME OF MATERIAL | CHEMICAL FORMULA | CURIE -POINT (°C) | RESIDUAL POLARISATION (REMANENCE) ($\mu C/CM^2$) | ANTI-ELECTRIC FIELD (kV/cm) | DIELECTRIC CONSTANT |
|---|---|---|---|---|---|
| LEADZIRCON TITANATE ACID (PZT) | $PbZrTiO_3$ | 387 | ~30 | ~20 | 1000 |
| BARIUM TITANATE ACID (BTO) | $BaTiO_3$ | 130 | 130 | 1.2 | 1000 |

FERROELECTRIC MEMORY USED FOR THE RFID SYSTEM, METHOD FOR DRIVING THE SAME, SEMICONDUCTOR CHIP AND ID CARD

BACKGROUND OF THE INVENTION

1. Field of the Invention

The present invention relates to a transponder used for the RFID (Radio Frequency Identification) system and, in particular, to a non-volatile ferroelectric memory, a drive method and an ID card thereof, which contains a memory cell array employing a ferroelectric layer for an information memory capacitor mounted on the transponder.

2. Discussion of the Background

The RFID system is referred to as a non-contact tag system (identifier) using electronic waves, which comprises a personal computer, a controller, antennas etc. The transponder contains chips such as a non-volatile ferroelectric memory and so on. Recently there has been much development and research activity related to the non-volatile ferroelectric memory for use in semiconductor memory devices with low power consumption. This non-volatile ferroelectric memory is described, for example, in U.S. Pat. No. 4,873,664 to Eaton, Jr. and S. S. Eaton, Jr. et al. "A Ferroelectric DRAM Cell for High Density NVRAMs", ISSCC Digest of Technical Papers, pp-130–131 (February 1988).

The memory capacitor for the ferroelectric memory cell consists of barium titanate acid ($BaTiO_3$), lead zirconium titanate acid (Pb (Zr, Ti)$O_3$; PZT), lanthanum doped lead zirconium titanate acid (Pb, La) (Zr, Ti)$O_3$; PLZT), lithium niobium acid ($LiNbO_3$), potassium lithium niobium acid ($K_3Li_2Nb_5O_{15}$) etc. These ferroelectric layers are polarized when a voltage is applied. The relation between voltage and polarization also exhibits a hysteresis property.

Regarding this relation, when the inventor measured the properties of the aforesaid ferroelectric layers, it was found that externally applied physical stress causes changes in the properties of the aforesaid hysteresis property. In other words, when physical stress was applied to the ferroelectric layer after it is formed, it was found that hysteresis property becomes worse and the value of polarization is deteriorated. The ferroelectric memory uses polarization for data holding. Accordingly, it is obvious that physical stress results in deterioration of the data holding properties.

FIG. 1(a) shows an arrangement of a conventional non-volatile semiconductor device memory cell array and peripheral circuits. Plural memory arrays are arranged in parallel, and the row decoder (word line selector circuit) 40 is used together therewith. Plural word lines (WL) are selected according to an address signal from the outside. The plate line (PL) is connected to the memory cell array (to a plate electrode of the cell capacitor), and driven by the plate decoder (plate line select circuit) 38 in the same manner as word line WL. Plate decoder 38 comprises a NAND circuit and an inverter circuit in series, and controls the plate electrodes by a logical operation of the word line signal and plate line control signal. A write signal or read signal through the word line or the plate line is a pulse signal. However, the pulse duration of the plate line signal to control the plate line signal is shorter than that of the word line signal, as shown in FIG. 1(b). Thus, since the plate line signal rises and falls in a short time, a read speed of the memory cell will be controlled by the plate signal pulse. The plate line, on the other hand, is connected in common to the aforesaid plate electrodes on the cell capacitors. In contrast, the word line is only connected to the transistor gate, and as a result the load capacity is very high. Thus, it takes a longer time to activate the plate line, compared to activating the word line. As a result, since the plate line is activated with a delay, it is impossible to obtain enough time to read all of the written data. It may also happen that the data can not be written completely in the cell. In order to avoid these troubles, it is necessary to increase the driving capability of a transistor in the inverter circuit in the plate line selector circuit 38. However, if the driving capability is unnecessarily increased, a word line driver pitch does not match with a plate line selector pitch for the row decoder circuit. A greater clearance between the word line and plate line is influenced by a smaller clearance between the word line and plate line, and the resulting area loss will occur.

As explained above, for a non-volatile ferroelectric memory used in a conventional transponder, when the plate line is decoded (pulse driven), high CR (capacitance and resistance) is required. So, the plate line is operated with a delay. In this instance, it is impossible to read all data written in the memory cell. There is also a fear that the data can not be written completely in the cell.

There is another problem, namely, when a non-volatile ferroelectric memory is mounted on a memory card etc., if a thin memory card is used, external physical stress is easily applied. As a result, a problem could arise wherein the hysteresis property (which is involved in data cohesion properties) may be degraded.

It is well known, that the shape of a hysteresis loop greatly changes with temperature. In other words, a hysteresis loop at high temperature (e.g. 80° C.) is smaller, compared to the shape of the loop at low temperature, which makes the value of polarization small. The ferroelectric memory employs polarization for data holding. Accordingly, the existence of a heat source within the chip leads to deterioration in the data holding property, particularly when a non-volatile ferroelectric memory is mounted on a memory card. Heat, which dissipates from a power supply circuit or a rectifier circuit, will have an adverse effect on the ferroelectric memory data holding property.

FIG. 2 shows a hysteresis loop for ferroelectric material applicable to the FRAM (ferroelectric random access memory) memory cell using the ferroelectric layer for a capacitor. For read and write operations, it is necessary to change operations along with the loop in the a→b→c→d sequence. Actually, however, a current flows only around points b and d. A polarization of the ferroelectric layer is inverted only at slightly flows at b and d. Accordingly, even when the plate line (PL) is activated as shown in FIG. 3(a), little current flows when the polarization is in the a and c areas. In the b and d areas in contrast, a pulse-like current flows, i.e., (FIG. 3(b)). If high current flows for such an extremely short time, the maximum current rate will increase. As a result, there is a possibility that various malfunctions would occur due to power fluctuations (noise) or reference voltage fluctuation, which has occurred therein.

SUMMARY OF THE INVENTION

It is an object of the present invention to provide a non-volatile ferroelectric memory which prevents malfunctions from occurring, when the plate line is decoded (pulse driven), as well as improving the drive speed of the plate line. The memory may be mounted on a transponder.

Another object of the invention is to provide a method of driving a non-volatile ferroelectric memory which can minimize a maximum current rate for the drive current flowing in the plate line, while enhancing the plate line drive speed.

A further object of the invention is to provide a nonvolatile ferroelectric memory having improved data holding properties, but also an ID card having improved data holding properties.

To achieve the above and other objects of the invention, the present invention provides a ferroelectric memory comprising a memory cell array having a plurality of memory cells, a plurality of word lines, a plurality of plate lines, a word line select circuit, selecting among the word lines, and a plate decoder, selecting memory cell among the plurality of memory cell array. The memory cell array may comprise a plurality of memory cell arrays and a plate line may be associated with a word line.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

A more complete appreciation of the present invention and many of its attendant advantages will be readily obtained by reference to the following detailed description considered in connection with the accompanying drawings, in which:

FIG. 14 is a diagram of another circuit for generating an input signal of the plate decoder;

FIGS. 15(a) and 15(b) are a diagram of a circuit for generating an input signal of the plate decoder, and a truth table for the input signal, respectively;

FIGS. 20(a) and 20(b) are timing diagrams of the plate line control line and of the total amount of current flowing in the plate lines according to the invention and the prior art, respectively;

FIGS. 21(a)–21(c) are diagrams of delay circuits for the delays shown in FIG. 19;

FIGS. 35(a) and 35(b) are respective plan and sectional views of a card substrate having a semiconductor chip according to the invention;

FIGS. 36(a) and 36(b) are respective plan and sectional views of a card substrate having a semiconductor chip according to the invention;

DETAILED DESCRIPTION OF PREFERRED EMBODIMENTS

Embodiments of the present invention will be described in detail with reference to the drawings.

The RFID system is referred to a non-contact tag system (identifier) using electronic waves, generally called a non-contact data carrier system. This invention relates to a transponder used in this system, and a non-volatile ferroelectric memory mounted on the transponder, and its driving method.

Figure 46A:
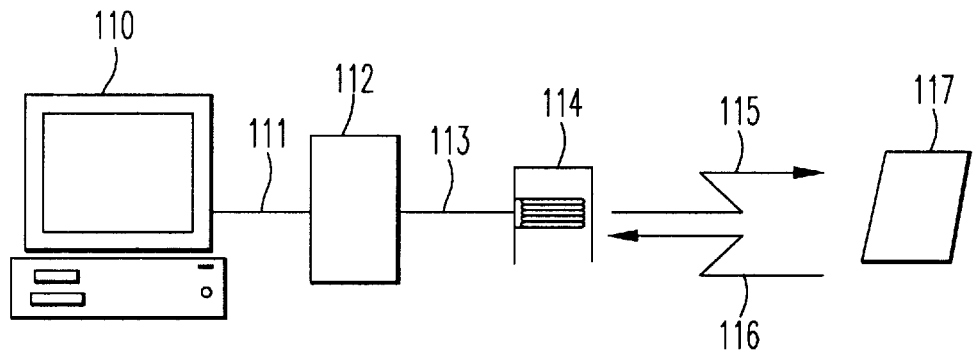
FIGS. 46(a)–46(c) are diagrams indicating an outline of RFID system, a perspective view of a transponder, and a plan view of RFID chip according to the invention, respectively.
Figure 46B:
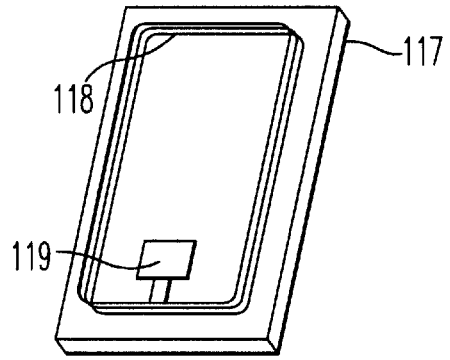
Figure 46C:
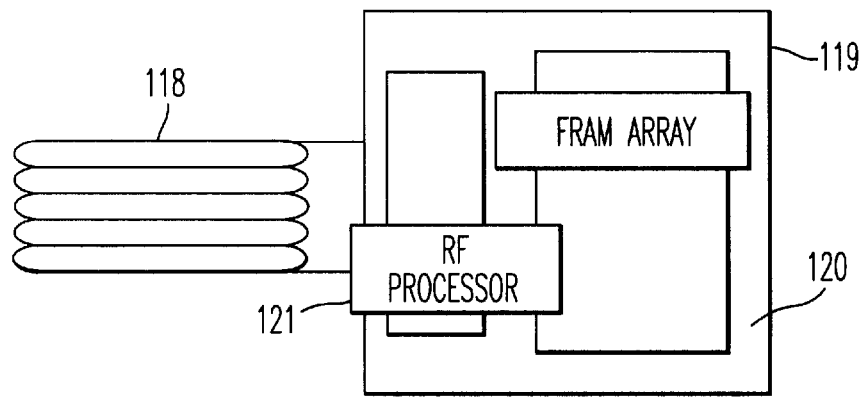

FIGS. 46(a)–46(c) show a system mechanism chart for the complete RFID system using a transponder according to the invention. The RFID system consists of the host side, which is composed of a personal computer 110, a controller 112, an antenna 114 and a data carrier 117, such as a transponder. A bus 111, such as RS-232, connects computer 11 and controller 112, and a cable 113 connects controller 112 and antenna 114. Antenna 114 sends power and command data 115 to carrier 117 and receives data 116.

The transponder has a simple structure, shown in FIG. 46(b), which contains an FRAM and ASIC monolithic RFID chip 119 in one chip within a card printed board, and an antenna 118 which functions as a power receiver, data receiver/transmitter together. FIG. 46(c) is a plan view of the monolithic RFID chip 119. Chip 119 may contain an FRAM array 120 and an ASIC RF front end processor 121. Command information and data are sent on the carrier waves from the host side, as required, while, if necessary, the transponder side generates power required from the carrier waves, and returns information to the host side, using data write and read by means of the transmitter. The non-contact tag employs no battery, reads the FRAM memory data with no physical contact using electronic waves. The information is rewritten, and can be utilized for management of personal entrance and exit. For example, it can be utilized to examine tickets using non-contact tags in pockets of clothes. Cars with non-contact tags attached to them need not stop to pay money at tollgates. It can be used to monitor or control going in and out of parking areas without personal supervision. Also, it can be utilized to manage a migratory fish or to check the where about of cattle.

Figure 47:
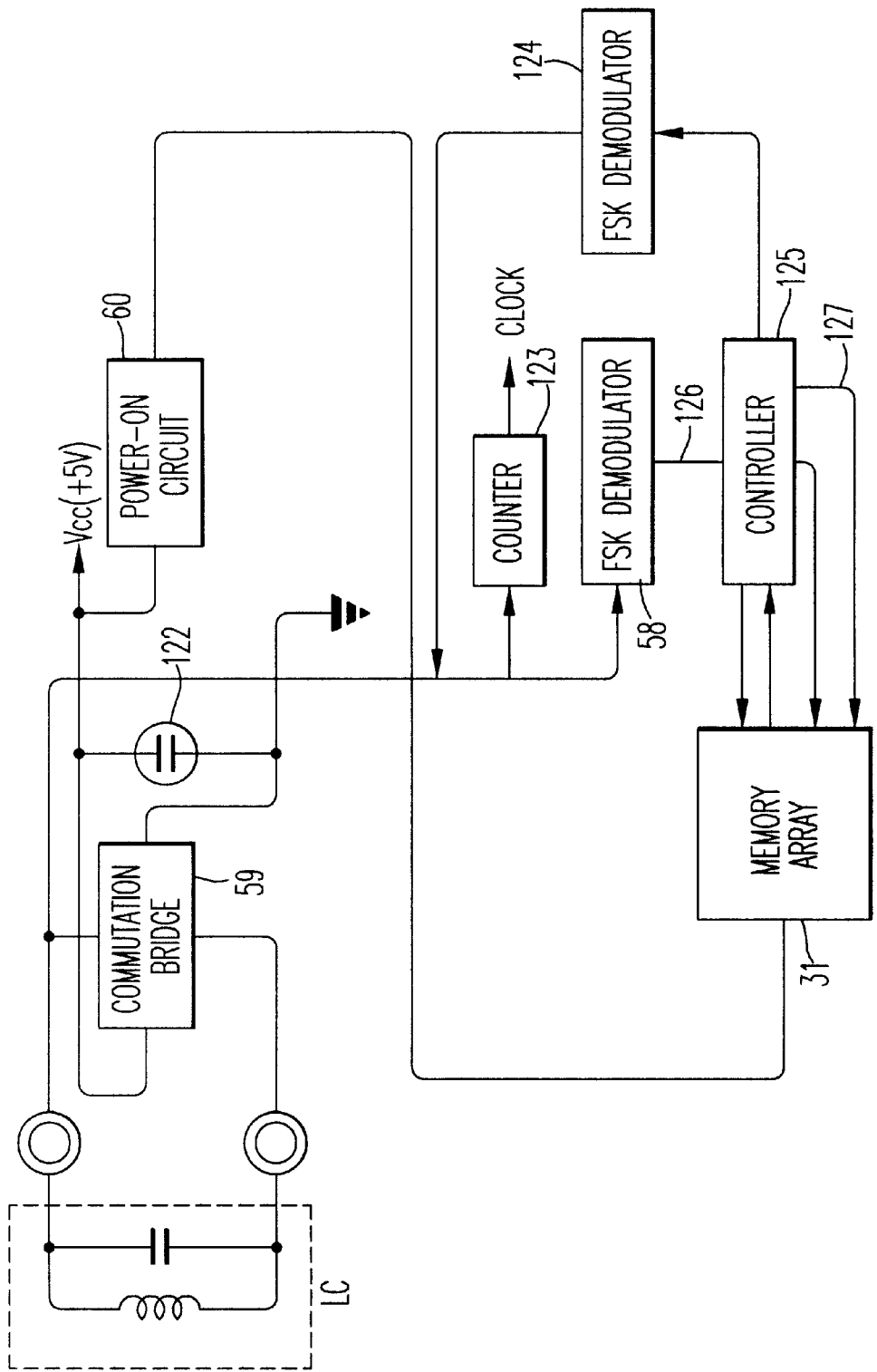
FIG. 47 shows an inner circuit of the transponder.

FIG. 47 shows details of internal circuits within the transponder. The memory cells are made up of an LC circuit to detect electromagnetic field input from the outside, and a circuit (FSK demodulation circuit) 58 generates a signal from the electromagnetic field which the LC circuit has detected. A circuit (rectifier bridge circuit) 59 generates a power supply voltage from the electromagnetic field which an LC circuit has detected, and a power-on signal circuit 60, which detects a power supply voltage rising, outputs the power-on signal. The transponder may also includes a counter 123 to produce a clock signal, a PSK modulator 124, and a controller 125 that receives, as well as other signals, a pulse signal 126 from modulator 58 and outputs signals to various circuits, such as read/write address 127 to array 31. A ferroelectric capacitor 122 containing ferroelectric layers between these electrodes, and a MOS transistor (not shown) to transfer an electric load are also included. All of these elements are arranged in a plural and discrete matrix.

For example, it is composed of the FRAM cell array 31, which connects a memory cell MOS transistor belonging to the same row in common with the same word lines. It connects either electrode of the ferroelectric capacitor of the memory cell belonging to the same row with the same capacitor plate line. It also connects either terminal of the memory cell MOS transistor belonging to the same column with the same bit line.

Figure 4:
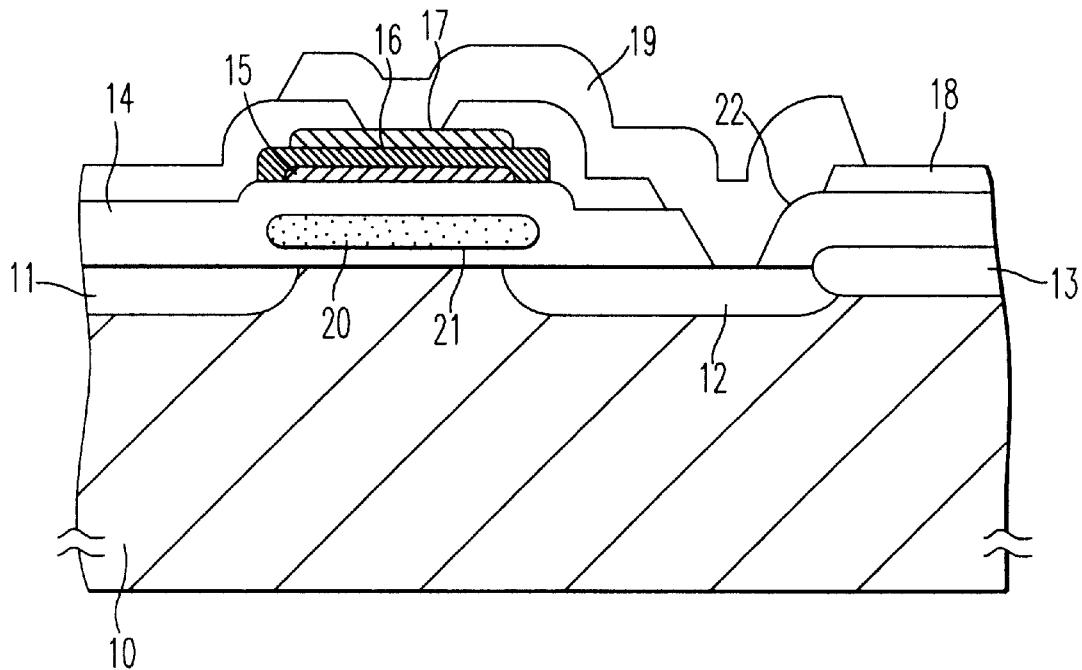
FIG. 4 is a sectional view of a FRAM cell in this invention.

Next, Referring to FIGS. 4 to 18, the first embodiment is described below. FIG. 4 shows a sectional view of the non-volatile ferroelectric memory, which may be mounted on the transponder. This ferroelectric memory, mounted on the transponder, is used as the monolithic RFID chip shown in FIG. 46(b). A device separated by the insulation layer 13 is formed on the surface of a P-type silicon substrate 10, and a MOS transistor is formed on an area portion separated by the insulation layer 13. The MOS transistor is composed of source/drain areas 11 and 12 consisting of, for example, an N-type diffused region, gate insulation layer 21, and gate electrode 20 consisting of, for example, polysilicon. The gate electrode 20 is also a word line (WL). Interlayer insulation layer 14, such as silicon oxide ($SiO_2$), is formed on the MOS transistor, while a contact hole 22 is formed to the source area 12 in the interlayer insulation layer 14. A ferroelectric capacitor is formed on the interlayer insulation layer 14. The ferroelectric capacitor is composed of lower layer 15, ferroelectric layer 16 consisting of, for example, a PZT layer, and upper layer electrode 17. The lower layer electrode 15 is called a plate electrode or plate line (PL). This ferroelectric capacitor is covered with interlayer insulation layer 18 consisting of, for example, a silicon oxide layer. The upper layer electrode 17 and source area 12 are electrically connected through the contact hole in the interlayer insulation layer 18 and through the contact hole 22 in the interlayer insulation layer 14 with contact wire 19.

Figure 5:
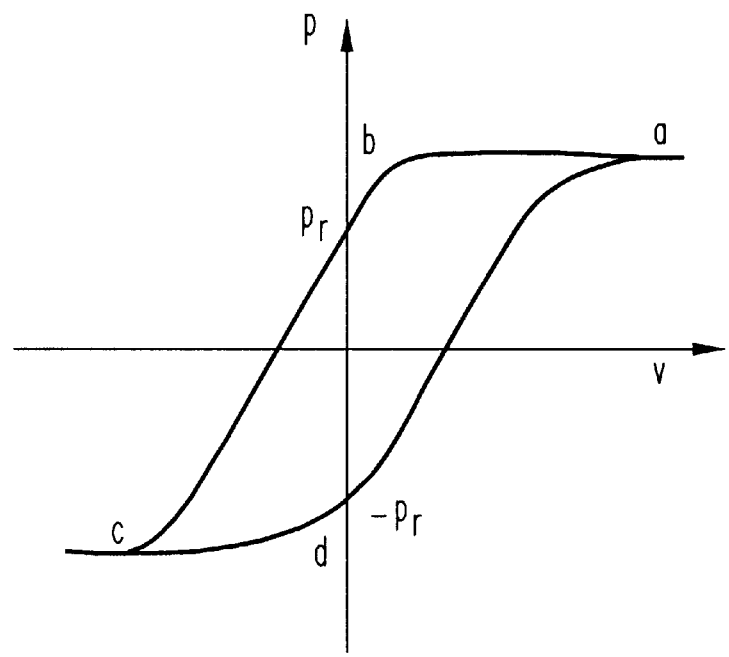
FIG. 5 shows hysteresis loop of ferroelectric film desirable for FRAM.

FIG. 5 shows applied voltage and polarization properties for the ferroelectric thin layer, when a PZT layer is used as the ferroelectric layer. The ferroelectric thin layer includes a hysteresis property, as also apparent from FIG. 5. The data can be stored according to whether a residual polarization Pr which is a value of polarization in a state without a voltage, that is, in a situation where V=0 V, is "positive" or "negative".

Figure 6:
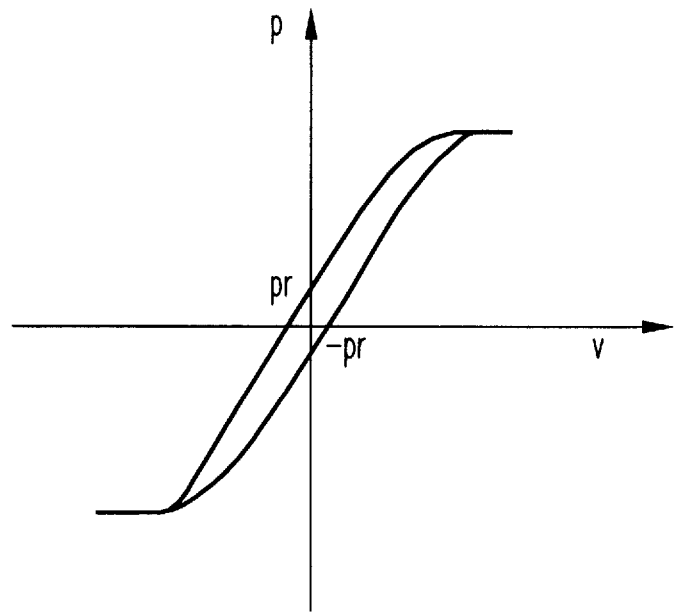
FIG. 6 shows hysteresis loop of ferroelectric film undesirable for FRAM.
Figure 7A:
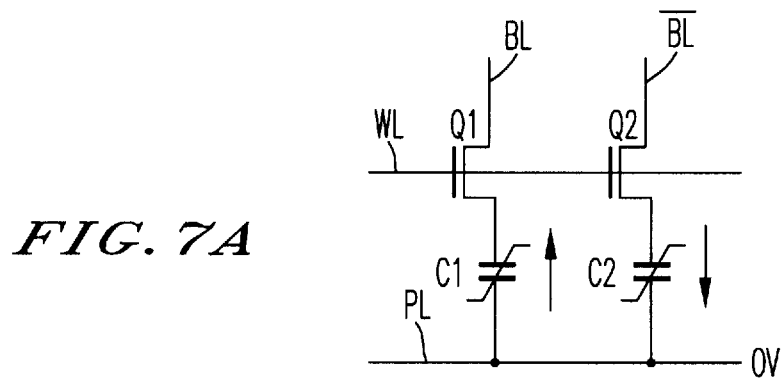
FIGS. 7(a) and 7(b) illustrate a data-writing operation in an FRAM cell.
Figure 7B:
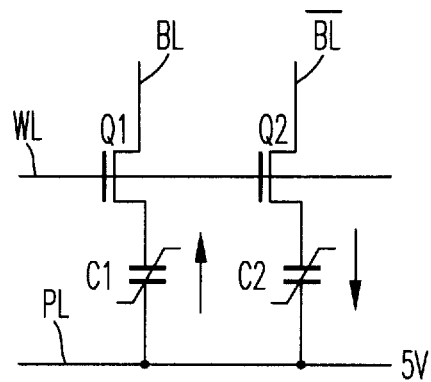
Figure 8:
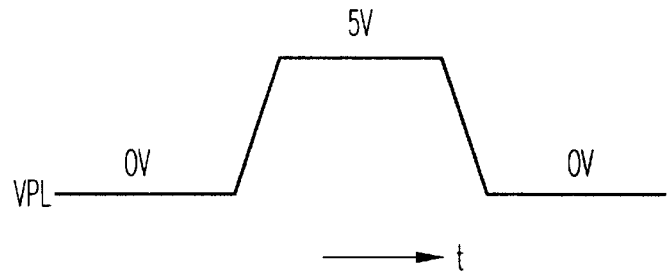
FIG. 8 shows a voltage variation of the plate electrode in data-writing.

FIG. 6 shows a hysteresis property which is not preferred in a ferroelectric memory. In other words, there could be a problem in which the residual polarization Pr is so low that a read margin may be reduced by the sense amplifier, and the data could be easily lost due to external disturbance. FIG. 6 also shows a hysteresis property under high temperature of 80° C. Consequently, operations on how to write in the memory cell, using the ferroelectric layer are described referred to FIGS. 7(a), 7(b) and 8. The non-volatile ferroelectric memory using the FRAM cell comprises two MOS transistors Q1 and Q2, and two ferroelectric capacitors C1 and C2. Referring to FIG. 7(a), upward polarization (hereafter, called positive polarization and indicated by the upward arrow) in capacitor C1, and downward polarization (hereafter, called negative polarization and indicated by the downward arrow) in capacitor C2, is defamed as logic state "1". FIG. 7(b) illustrates logic state "0" where capacitor C1 has negative polarization, and capacitor C2 has positive polarization. The procedure to write "1" in the memory, is described as follows. FIG. 8 shows the write potential (VPL) applied to the plate electrode PL. First of all, a 5 V potential is applied to bit line BL, and a 0 V potential is applied to the bit line $\overline{BL}$, which indicates an inverse signal (hereafter, described similarly). Further, a 7 V potential is applied to the word line WL, and a 0 V potential is applied to the plate line PL. This indicates that a polarization state of capacitor C1 is in state "a", and a polarization state of capacitor C2 is in state "b", as shown in FIG. 5.

Next, PL is set to 5 V. As a result, the polarization state of capacitor C1 is moved to state "b", and the polarization state of capacitor C2 is moved to state "c" as shown in FIG. 5. PL is then set to 0 V. As a result, capacitor C1 is returned to state "a", and capacitor C2 is placed in state "d", as shown in FIG. 5.

As described above, capacitor C1 is set to positive polarization, and capacitor C2 is set to negative polarization, as shown in FIG. 7(a) to write "1".

The procedure to write "0" in the memory, is described as follows. First of all, a 0 V potential is applied to the bit line BL, and a 5 V potential is applied to the bit line $\overline{BL}$. Further, a 7 V potential is applied to the word line WL, and a 0 V potential is applied to the plate line PL. This indicates that a polarization state of the capacitor C1 is in state "b", and a polarization state of the capacitor C2 is in state "a", as shown in FIG. 5.

Next, PL is then set to 5 V. As a result, polarization state of the capacitor C1 is moved to state "c", and the polarization state of capacitor C2 is moved to state "b", as shown in FIG. 5. PL is then set to 0 V. As a result, capacitor C1 is moved to state "d" and capacitor C2 is moved to state "a", as shown in FIG. 5.

As described above, capacitor C1 has positive polarization and appears in the state as indicated in FIG. 7(a), and capacitor C2 has negative polarization, when a logic state "0" is written.

Such a non-volatile ferroelectric memory, as mentioned above, which has low power consumption, is available for unpowered ID devices. The unpowered supply ID (identification) device receives radio waves externally, and uses as a power source the AC voltage obtained by rectifying the radio waves. Moreover, the ID device receives information, which is changed into a carrier wave, and inputs/outputs the external data.

In general, the electronic wave transmitter circuit is also mounted on the unpowered supply ID device. If the above configuration is established, the ID card can be configured without a power supply. When external information is to be communicated when there is no contact to the existing equipment. The unpowered ID card, as mentioned above, has application to licenses, product catalogs, personal certificates, punch tickets, and ski lift tickets.

Figure 9:
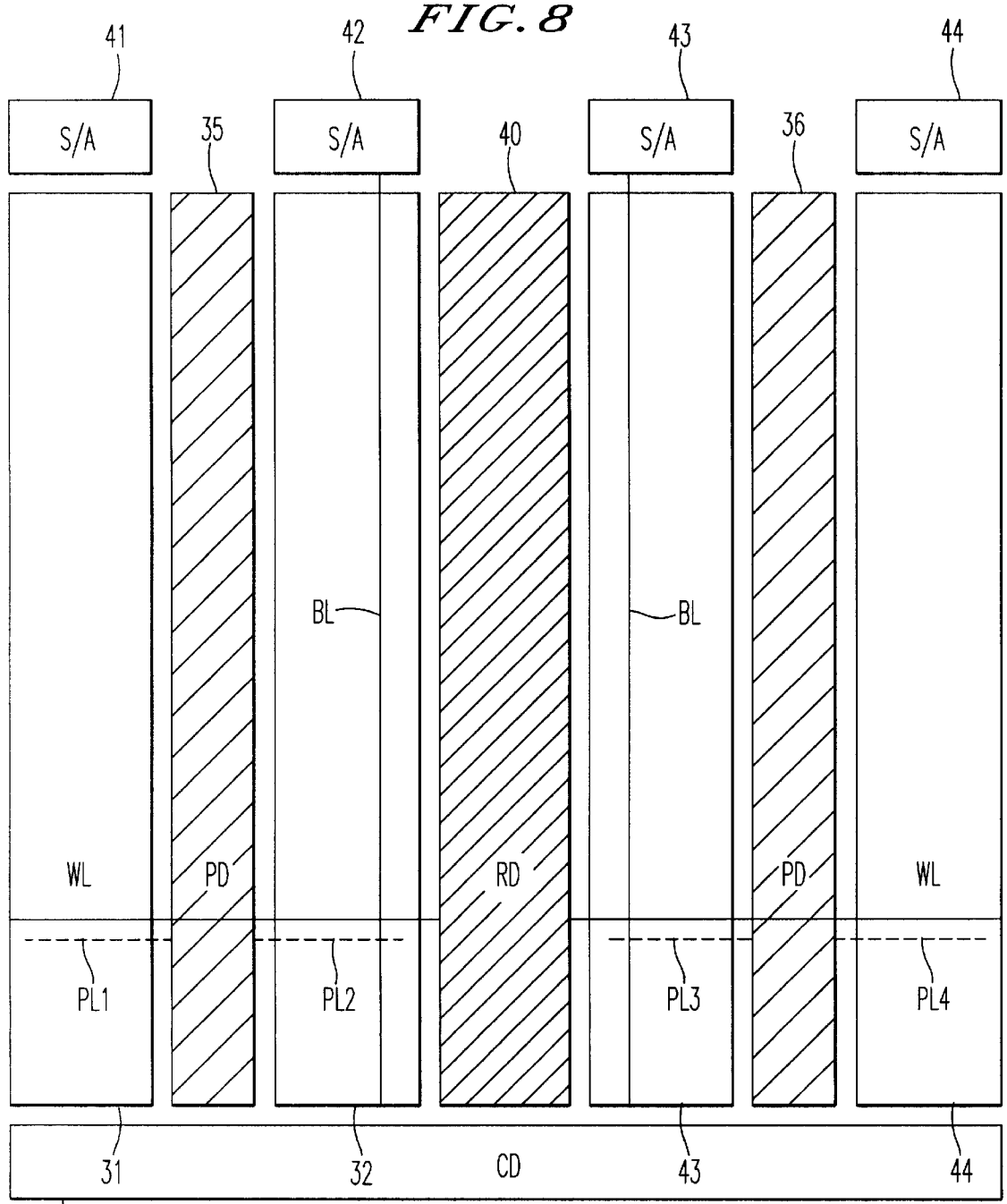
FIG. 9 is a diagram of an FRAM cell and a peripheral circuit according to the invention.
Figure 10:
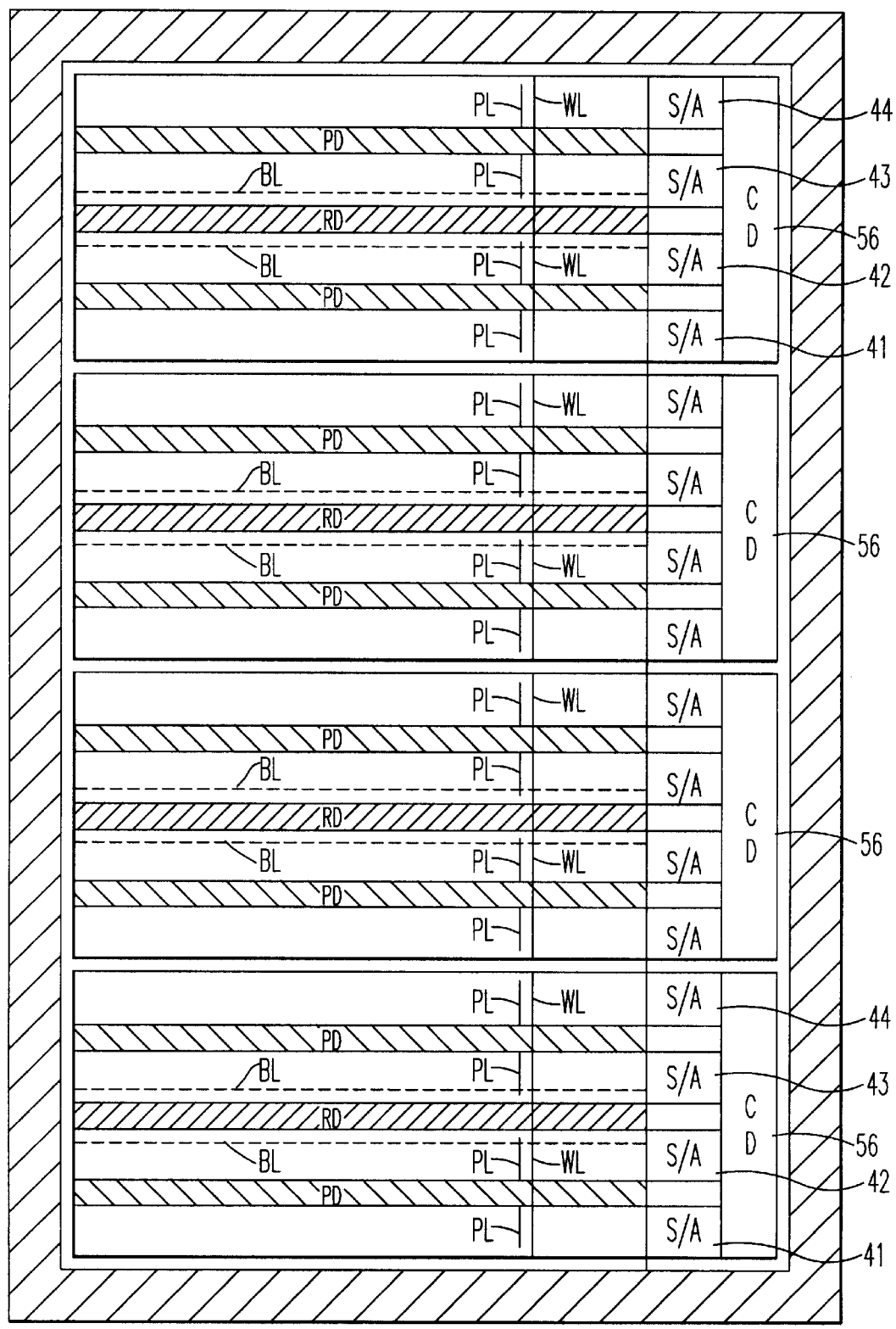
FIG. 10 is a diagram of another FRAM cell and a peripheral circuit according to the invention.

FIGS. 9 and 10 shows an arrangement of memory cell arrays for the non-volatile memory and peripheral circuits. Memory cell arrays 31 to 34 are arranged in parallel, in conjunction with a row decoder 40. Row decoder 40 may be located at the center, to which plural word lines (WLs) are connected. Further, the memory cell arrays, which are separated left and right by the row decoder 40, are also divided by plate decoder (PD) 35 and 36. Plate line PL (PL1, PL2, PL3, PL4) are coupled to those plate decoders 35, 36.

The row decoder 40 according to address signals selects a word line WL. The plate line PL is provided for each memory cell array, and operated with plate decoders 35 and 36 as shown in FIG. 9. Sense amplifier circuits (S/A) 41 to 44 are also provided for each memory cell array. The circuits amplify a slight potential difference, which appears between a pair of bit lines. A column gate circuit (not shown in the figures) selectively connects the data line and bit line based on a signal from a column select line. The column decoder (CD) 56 selects the column selector (not shown in figures) according to address signals. The data line sense amplifier circuit (not shown in the figures) amplifies the data fed in over the data line.

Figure 11:
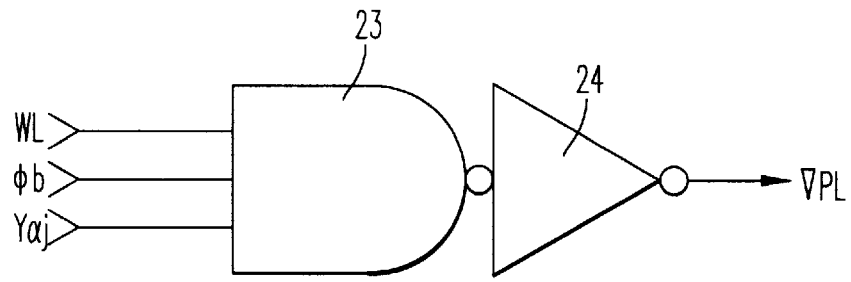
FIG. 11 is a circuit diagram of a plate decoder used in this invention.
Figure 12:
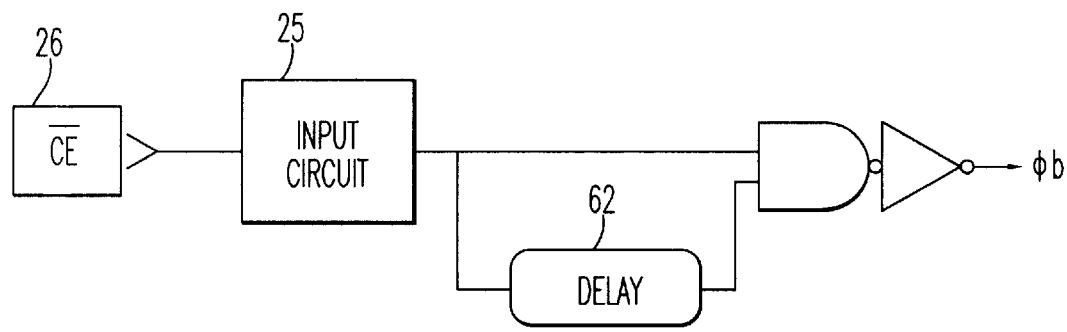
FIG. 12 is a diagram of a circuit generating an input signal of the plate decoder.

FIG. 11 shows a plate decoder, according to the invention. The plate decoder consists of a NAND circuit 23 and an inverter circuit 24, coupled in this order, and produces a decoder output signal. The inverter circuit feeds a power voltage (Vcc) as the plate voltage (VPL). The NAND circuit has three input signals. The $\phi 6$ signal is produced using a delay 62 and a pulse signal from an input circuit 25 receiving as input the $\overline{CE}$ (Chip Enable Signal) 26, which is the same as $\overline{RAS}$ for a DRAM (see FIG. 12). The $Y\alpha$ signal which is a partial address signal, an address which is related to the column direction. WL indicates the word line corresponding thereto. Hence, for example, the memory cell arrays, as shown in FIGS. 9 and 10, the four divided plate lines PL correspond to a portion of word line WL. Thus, one plate line is selected from among the four plate lines according to the address signal ($Y\alpha$). Accordingly, the capacitance of the plate line decreases to one-fourth of the capacitance of a conventional plate line. A speed of the plate line decoder according to the invention is much faster, which can prevent malfunctions. Furthermore, the memory cell array, which is activated by this address signal is about one-fourth of the size of conventional array, which reduces power consumption.

Figure 13:
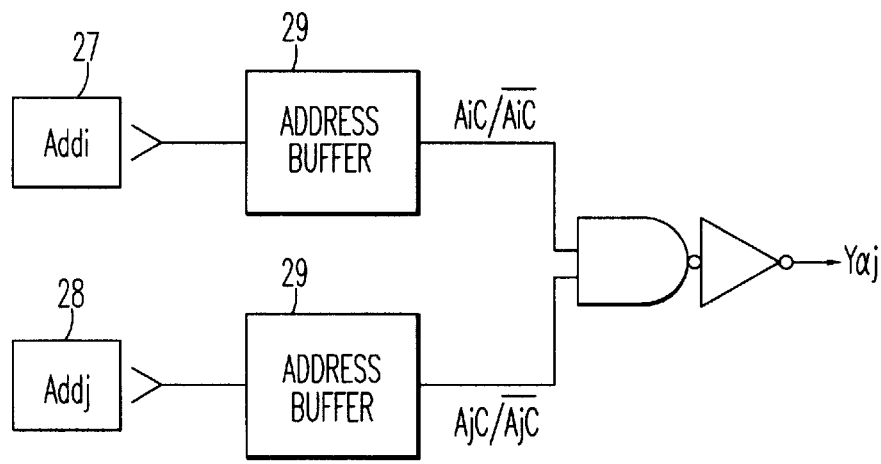
FIG. 13 is a diagram of another circuit for generating an input signal of the plate decoder.
Figure 16:
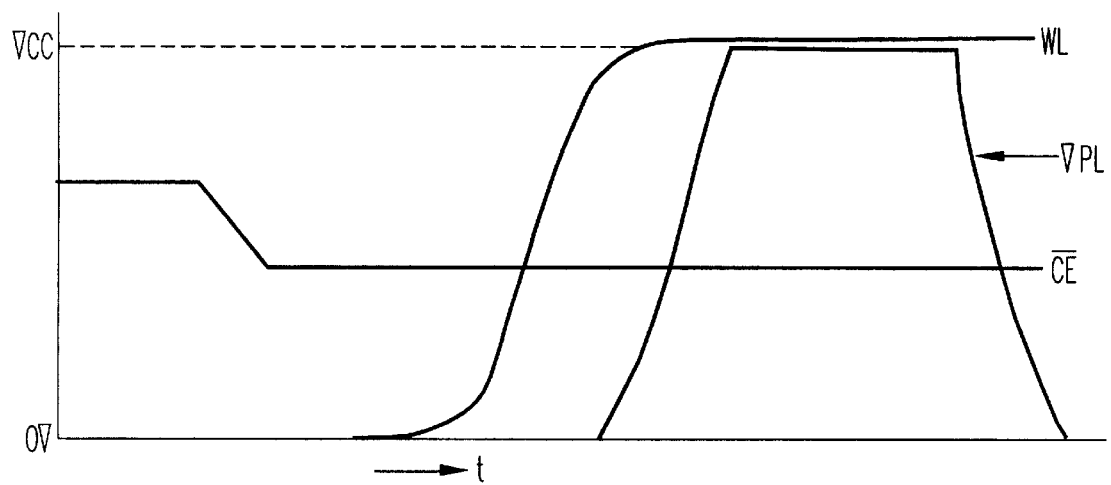
FIG. 16 is a timing chart of the plate decoder according to the invention.

FIG. 14 shows another embodiment of the plate decoder. For example, if two addresses i and j exist (signals 27 and 28), complimentary signals such as Aic, $\overline{Aic}$, Ajc, and $\overline{Ajc}$ are generated by the address buffer 29 (FIG. 13). As shown in FIG. 15(a), the plate decoder comprises a NAND circuit and an inverter circuit. The complimentary signals are input to the plate decoder, which outputs a input signal $Y\alpha$ for the plate decoder shown in FIG. 14. FIG. 15(b) shows a logic table for the complimentary signals. As a result, four $Y\alpha j$ signals ($Y\alpha 0$, $Y\alpha 1$, $Y\alpha 2$, and $Y\alpha 3$) can be generated. If four $Y\alpha$ signals are input in the plate decoder, as shown in FIG. 14, one VPL of four plate voltages (VPL) can be operated with pulse activation. A timing diagram for the plate decoder input signals (WL, VPL, $\overline{CE}$ ($\phi 6$) in FIGS. 11 and 14) are shown in FIG. 16.

Figure 17:
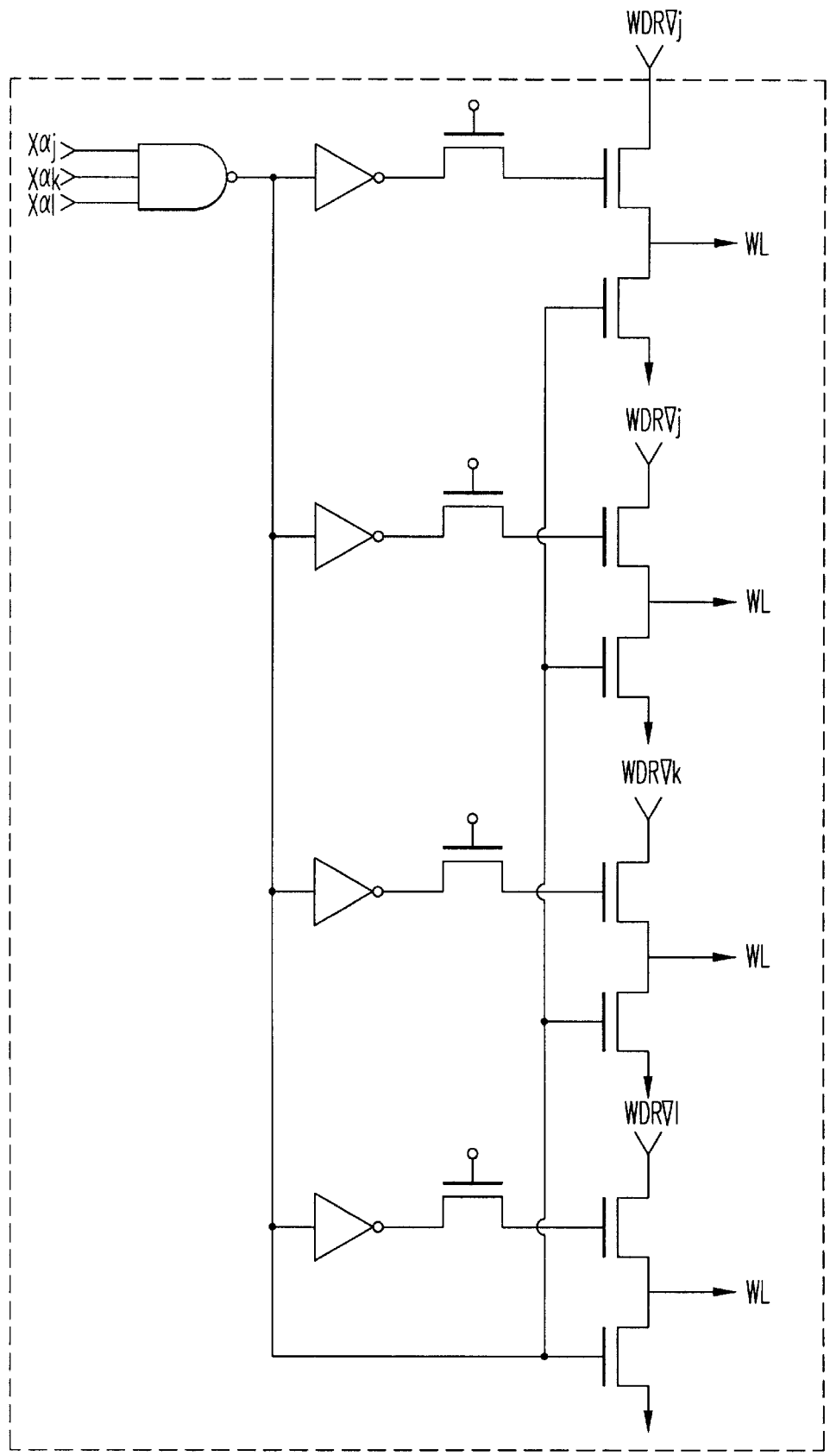
FIG. 17 is a diagram of a row decoder according to the invention.

The circuit diagram for the row decoder 40, as shown in FIGS. 9 and 10, is detailed in FIG. 17. The row decoder 40 is a circuit used to select the word line. The decoders are selected by signals $X\alpha j$, $X\alpha k$, $X\alpha l$ which predecode a row address. Four word lines are connected to each decoder, one of which is selected by signals WDRVi to WDRV1.

Figure 18:
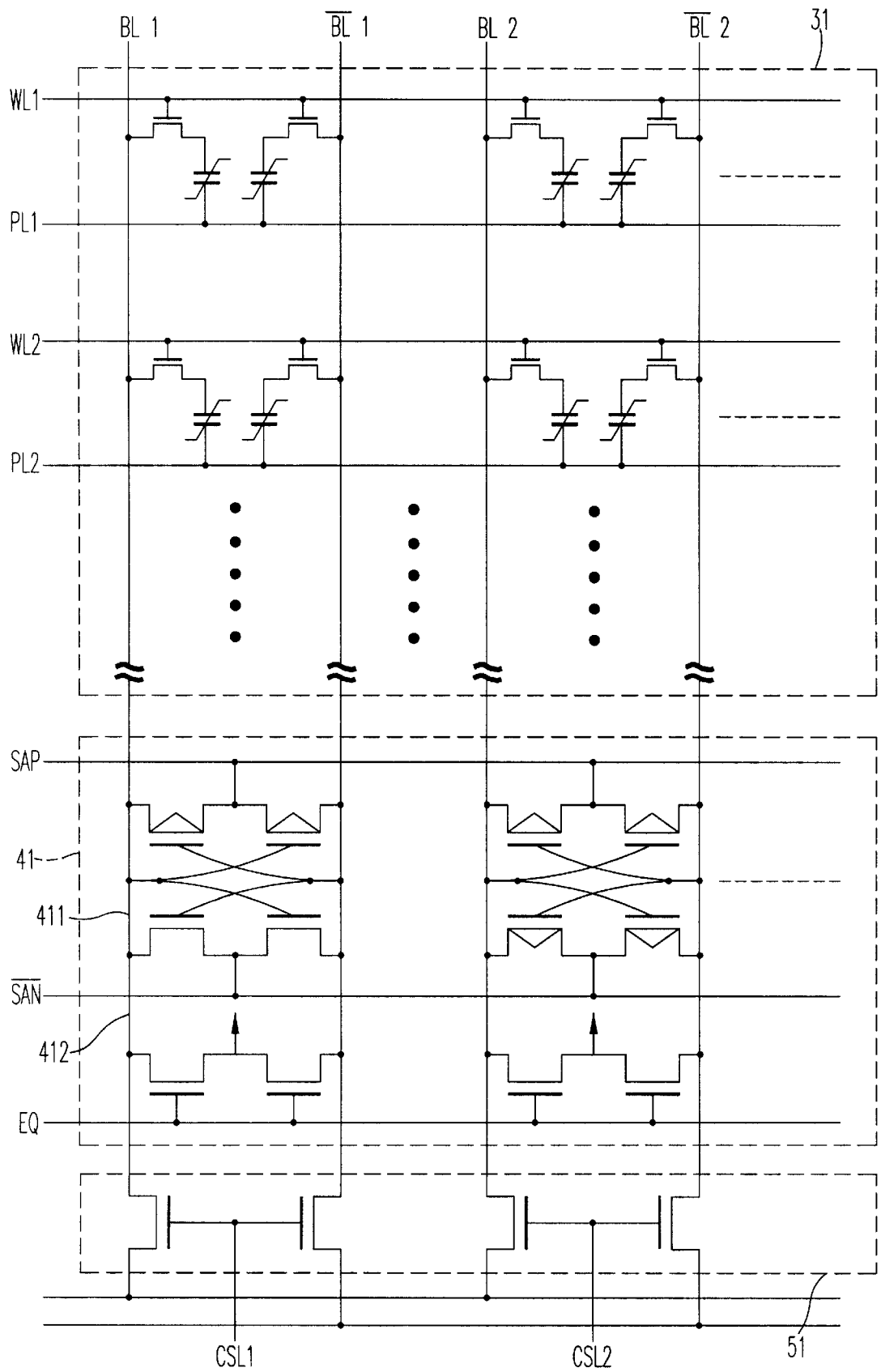
FIG. 18 is a diagram of an FRAM cell and a peripheral circuit according to the invention.

FIG. 18 shows details of the sense amplifier used for the memory cell arrays of FIGS. 9 and 10. The memory cell array 31, the sense amplifier circuit 41, and the column gate circuit 51 are detailed in FIG. 18. The memory cell array 31 includes the memory cells 30, which are arranged in columns and rows. The memory cells arranged in the same column are connected to the same pair of bit lines (Bln; $\overline{Bln}$) (n=1, 2, ... ). The memory cells arranged in the same row are connected to the same word line WLn (n=1,2, ... ), plate line PLn (n=1,2, ... ). The sense amplifier circuit 41 consists of plural sense amplifiers 411, and the sense amplifiers each consist of two cross-connected P type MOS transistors, and two cross-connected N type MOS transistors. Sense amplifiers 411 are driven and controlled by the P type sense amplifier drive line (SAP); and N type sense amplifier drive line ($\overline{SAN}$). In addition, an equalizer circuit 412 consisting of two N type MOS transistors is connected to each bit pair, and controlled by the equalizer select line EQ. In column gate circuit 51, each column gate, consisting of a column gate connected to a bit line, is composed of two MOS transistors. These MOS transistors are selected and driven by column select lines CSL.

Figure 19:
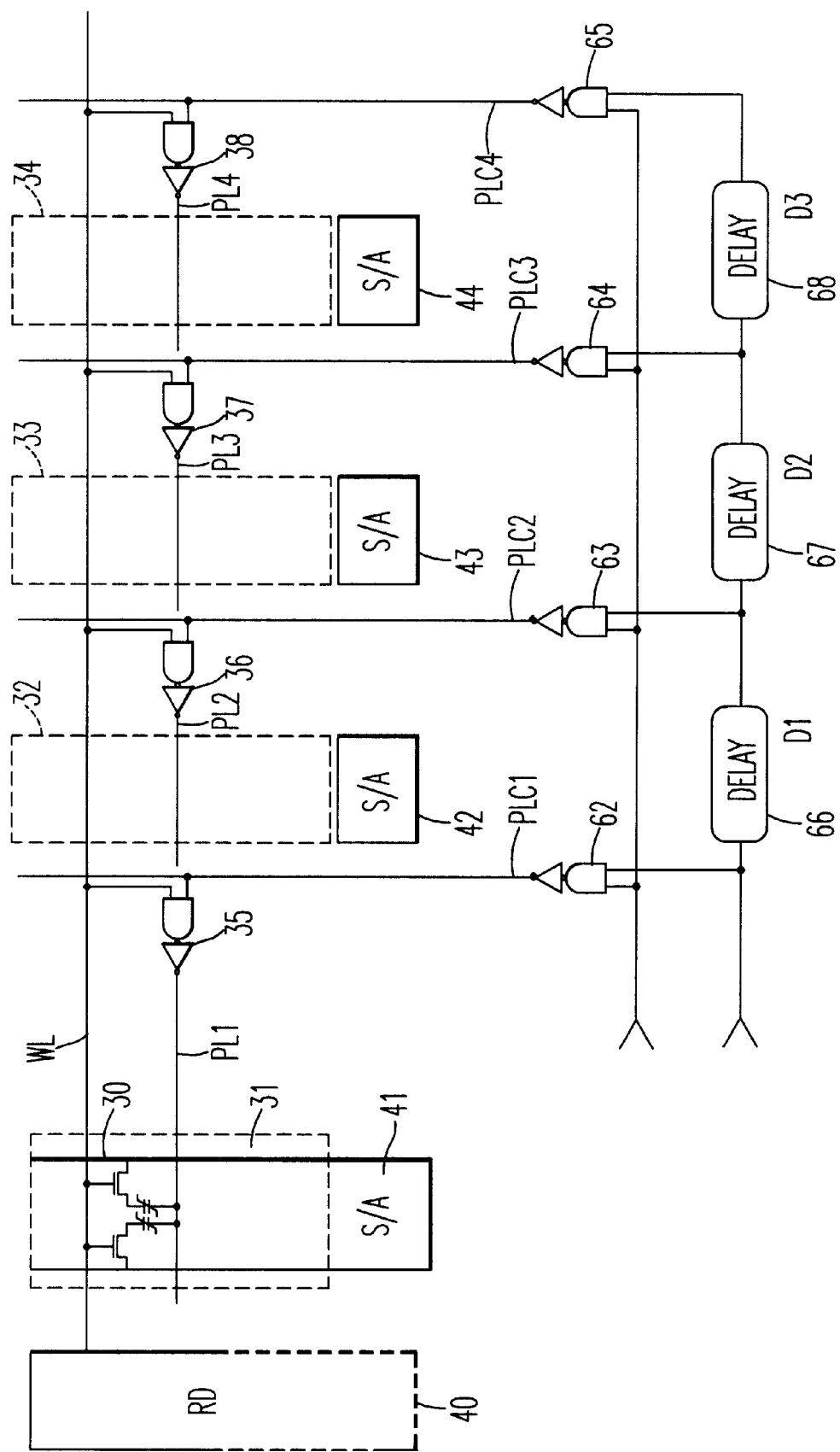
FIG. 19 illustrates a part of an arrangement between a FRAM cell and a peripheral circuit according to the invention.

A second preferred embodiment will now be described referring to FIGS. 19 and 21. FIG. 19 shows a memory cell array for a non-volatile ferroelectric memory (FRAM) which may be mounted on a transponder, and peripheral circuits, Memory cell arrays 31 to 34 contain memory cells (FRAM cell) 30, using a ferroelectric layer as an information memory capacitor, arranged in a matrix. Word line WL connects the gates of the transistors in the memory cells 30. The plate lines PL1 to PL4, connecting in common electrodes of the capacitor in memory calls 30 in the same row, are divided into "n" sections in the row direction (in this example, four partitions). The plate lines are respectively connected to four plate line select circuits 35 to 38. These plate line select circuits consist of a NAND circuit and an inverter circuit, where the inverter circuit feeds a power supply voltage Vcc to the plate line as a plate voltage (VPL). Plural plate line control lines PLC1 to PLC4 are respectively connected to an input of the plate line selector circuits and arranged in the column direction. WL is connected to the another input. Plate line control line driver circuits 62 to 65, are connected to the plate line control lines, respectively, to independently drive the plate line control lines. This embodiment is characterized in that the plural plate lines are independently driven, and a drive timing of the plural plate lines is shifted with respect to each other to reduce the transient current.

As shown in FIG. 19, for example, plate lines PL (PL1 to PL4), which are driven and controlled independently, are arranged in the four drive blocks. Plate line control driver circuits 62 to 65, which drive and control those plate lines PL, contain individual delay line chains 66 to 68 (with delays D1, D2, D3). Since this causes a slight shift to occur between peaks of current flows of each plate line (PL1 to PL4), as shown in FIG. 20(*a*), a maximum flow rate |sum| will be markedly reduced, compared to the conventional method (FIG. 20(*b*)).

As described above, the present invention is capable of reducing an electromotive force of a power supply circuit in the transponder to the amount of the maximum flow rate of the plate line. Moreover, the maximum flow rate occurs noises. According to this embodiment, it is possible to prevent peripheral circuit to working wrong timing.

Figure 1A:
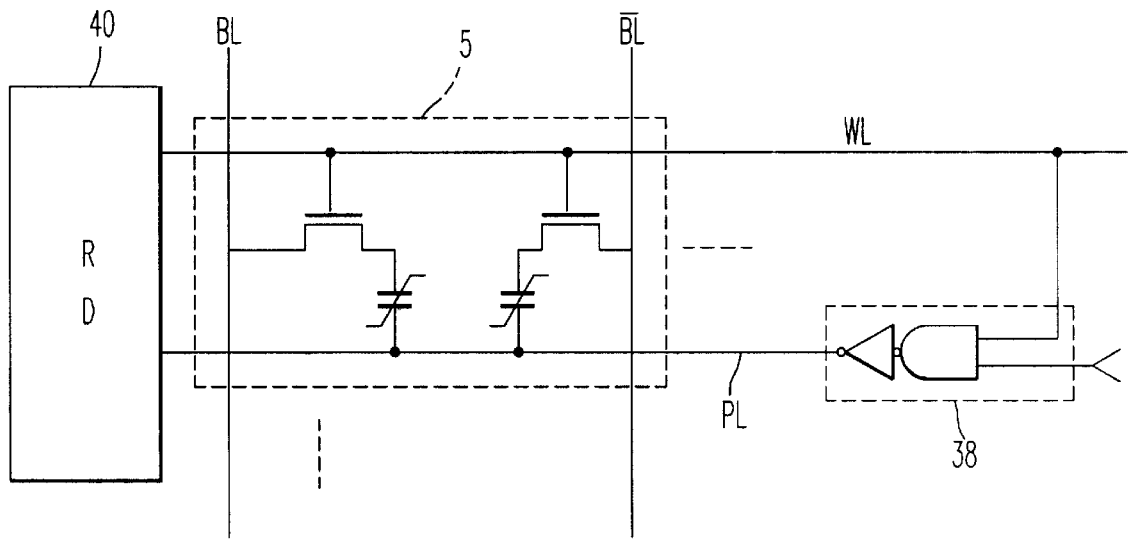
FIG. 1(a) shows a conventional arrangement of a FRAM cell and a peripheral circuit.
Figure 1B:
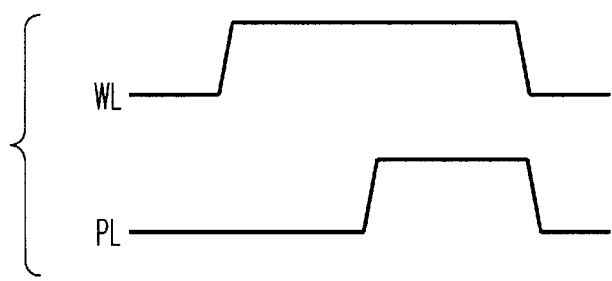
FIG. 1(b) shows drive waveforms applied to the circuit of FIG. 1.
Figure 2:
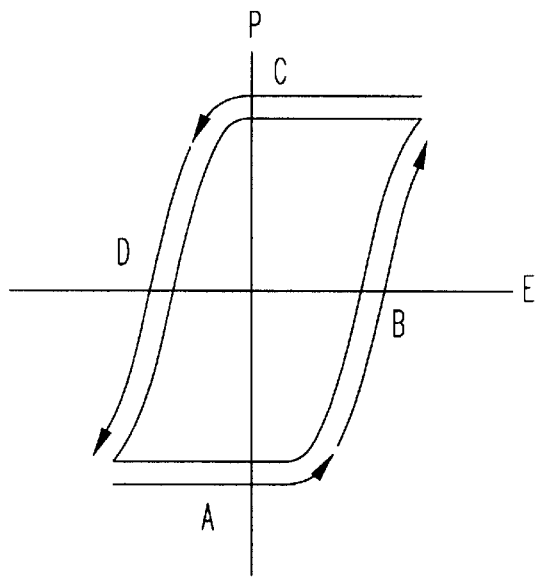
FIG. 2 is a hysteresis loop of the FRAM.
Figure 3A:
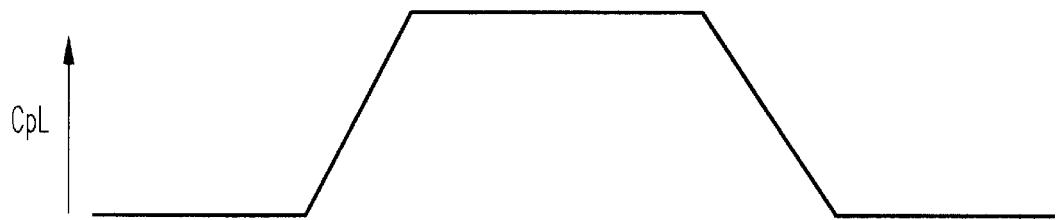
FIGS. 3(a) and 3(b) show a voltage for driving a plate line of the FRAM and the resulting currents, respectively.
Figure 3B:
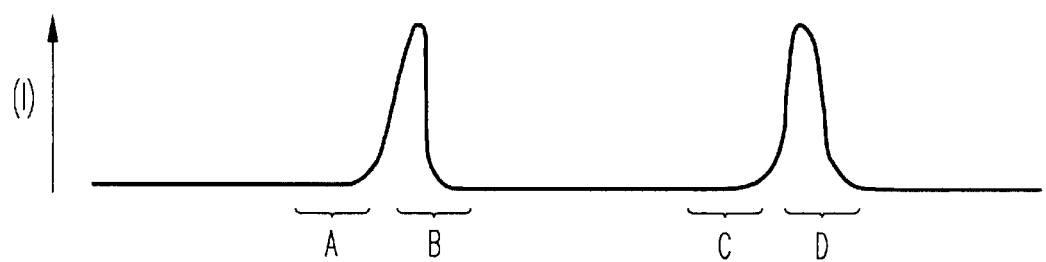

In this embodiment, the delay time should preferably be adjusted for the delay line. The longer the delay time is, the longer the read and write cycles are, making it impossible to provide a high speed memory. In the FRAM, as described above (see FIG. 3(*b*)), a pulse-like current flows. Accordingly, the rise or fall time of current flow for each plate line may overlap. More particularly, as shown in the example of FIG. 20(*a*), it takes about 5 ns for each line plate to rise and fall. A current flows, however, in the rise and fall times. In this case, there are 4.5 ns increments to overlap therewith. The delay time for the delay line should therefore be greater than about 0.5 ns. In general, if the rise time for the plate line is set as "t", and rises in a ramp state, it is well-known that a current will not flow for nearly 90 percent of the time, the current flows only for about the last 10 percent of the time. As a result, one-tenth or more delay time should be set.

An example for the delay line is shown in FIGS. 21(*a*) –21(*c*). Connecting inverter circuits in series in general, composes the delay line. However, if the delay time is less than 1 ns, it is assumed that it can be provided with metallic wiring only. FIGS. 21(*a*) and 21(*b*) show an inverter circuit, and FIG. 21(*c*) shows an example of metallic wiring using, for example, aluminum.

Figure 22:
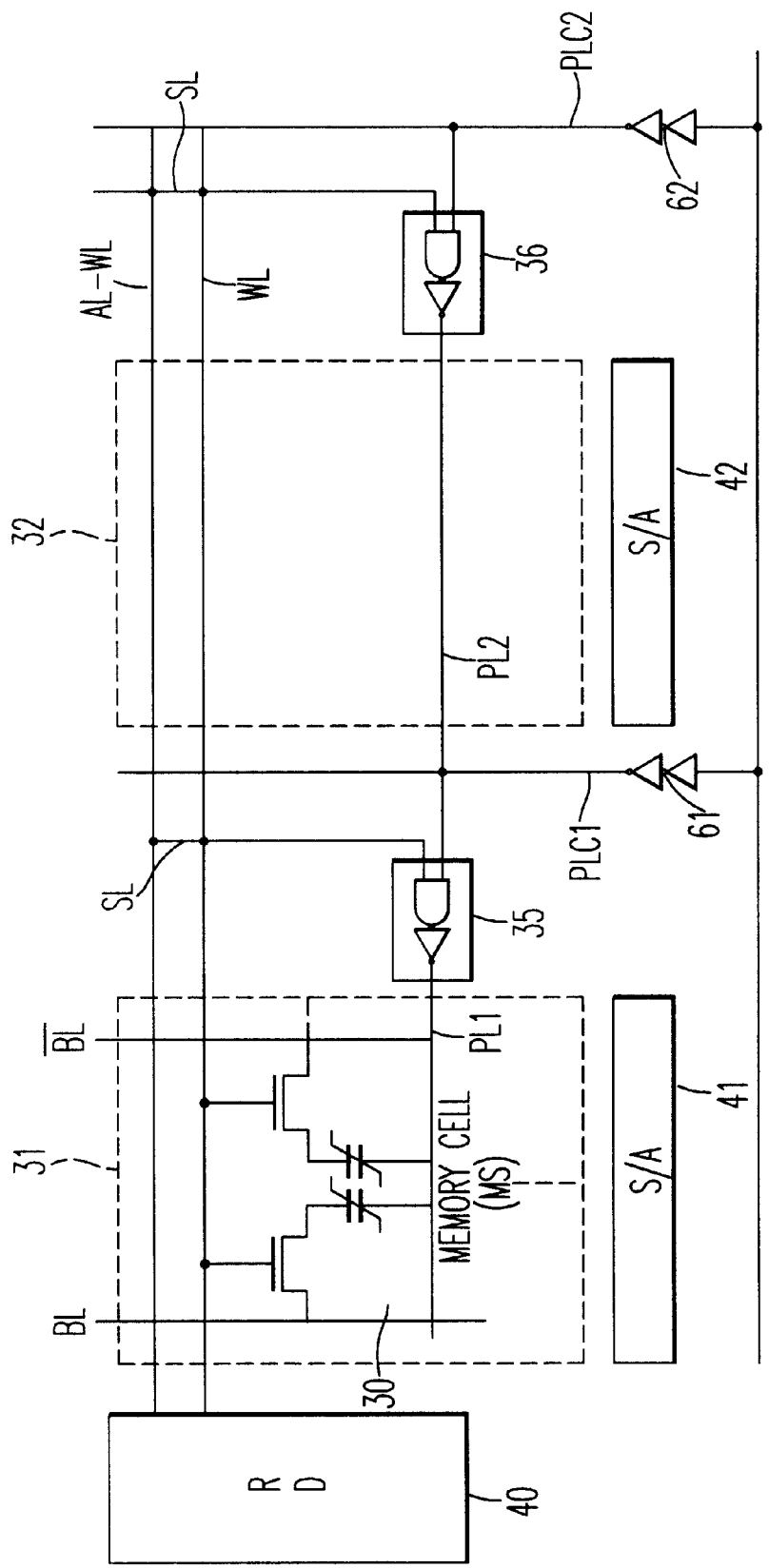
FIG. 22 is a diagram of a part of FIG. 19.

Next, a third embodiment of the invention will be described referring to FIGS. 22 and 26. FIG. 22 is a partial circuit diagram, which shows a memory cell array for the nonvolatile ferroelectric memory that can be mounted on the transponder, and detailed structures for peripheral circuits. Memory cell arrays 31, 32, . . . having memory cells (FRAM cells) 30, using a ferroelectric layer as a capacitor, are arranged in a matrix (rows and columns). Word line WL connects transistor gates of associated memory cells 30 in common. Metallic wiring word lines Al–WL, such as aluminum, are formed on the semiconductor substrate, and are separated from word line WLs, by an interlayer insulation layer. Word lines WL are connected to Al layer wiring word lines AL–WL at a given interval by means of shunt lines SL. The plate lines PL (PL1, PL2, . . . ), connected in common to an electrode of the capacitor in memory cells 30 in the same row, are divided into "n" sections in the row direction. Plate line select circuits 35 to 36 are connected to the "n" sections of the plate line. The plate line select circuits 35 to 36 consist of a NAND circuit and an inverter circuit, where the inverter circuit feeds a power supply voltage Vcc to the plate line. Plate line selector circuits 35 and 36 are arranged in the shunted areas of the memory cell array area.

Plural plate line control lines PLC (PLC1, PLC2,) are arranged along with the plate line selector circuits in the column direction. Plate line control line driver circuits 61, 62, . . . , are connected to the plate line control lines, respectively, to independently drive the plate line control lines. Plate line control line PLC is also connected to one of the two inputs for the NAND circuit in the plate line selector circuits 35 and 36, and gate line WL is connected to the another input.

The memory cell transistor gate capacitor (C1) is smaller than the aforesaid memory capacitor (C2), i.e., C1<C2.

Figure 23:
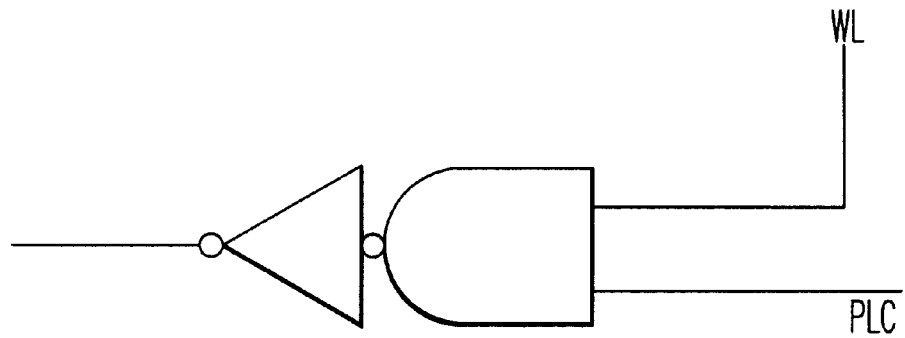
FIG. 23 is a diagram of a plate line select circuit according to the invention.

FIG. 23 is a circuit diagram for plate line selector circuits 35 and 36. Plate line selector circuits 35 and 36 comprise a NAND circuit and an inverter circuit connected in series, and generate a select signal determined by the word line signal WL and plate line control signal PCL. Plate lines PL (PL1, PL2 . . . ) are activated by the plate line selector circuits 35 and 36.

Figure 24:
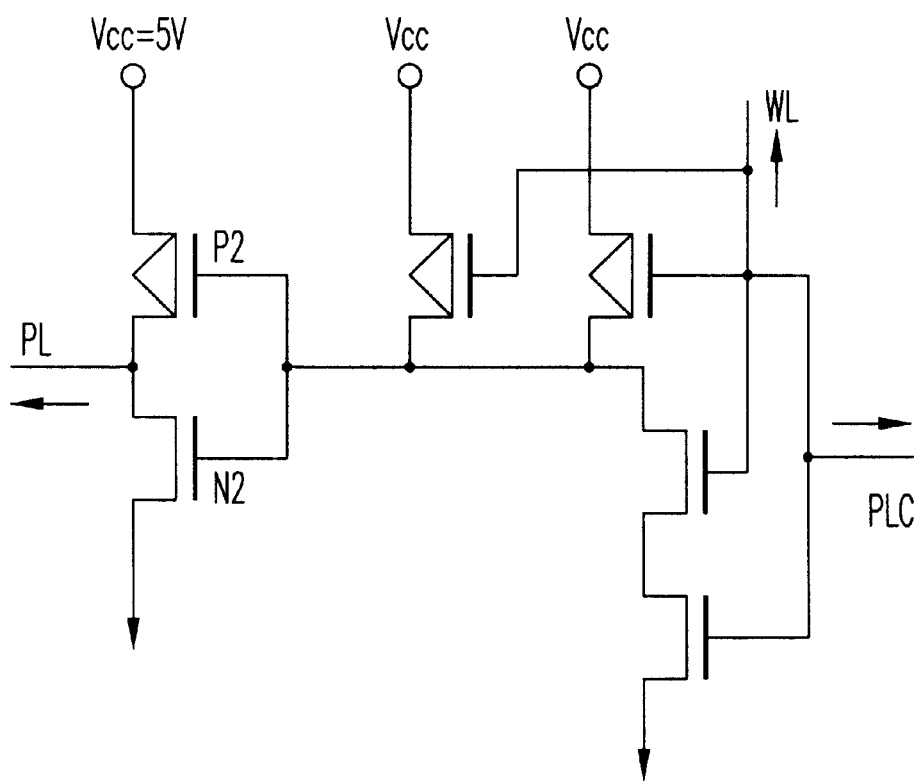
FIG. 24 is a circuit diagram of the circuit of FIG. 23.

FIG. 24 is a detailed circuit diagram of the circuit of FIG. 23. The inverter circuit is composed of N channel transistor N2 and P channel transistor P2. In this embodiment, the power supply voltage Vcc is 5 V.

Figure 25:
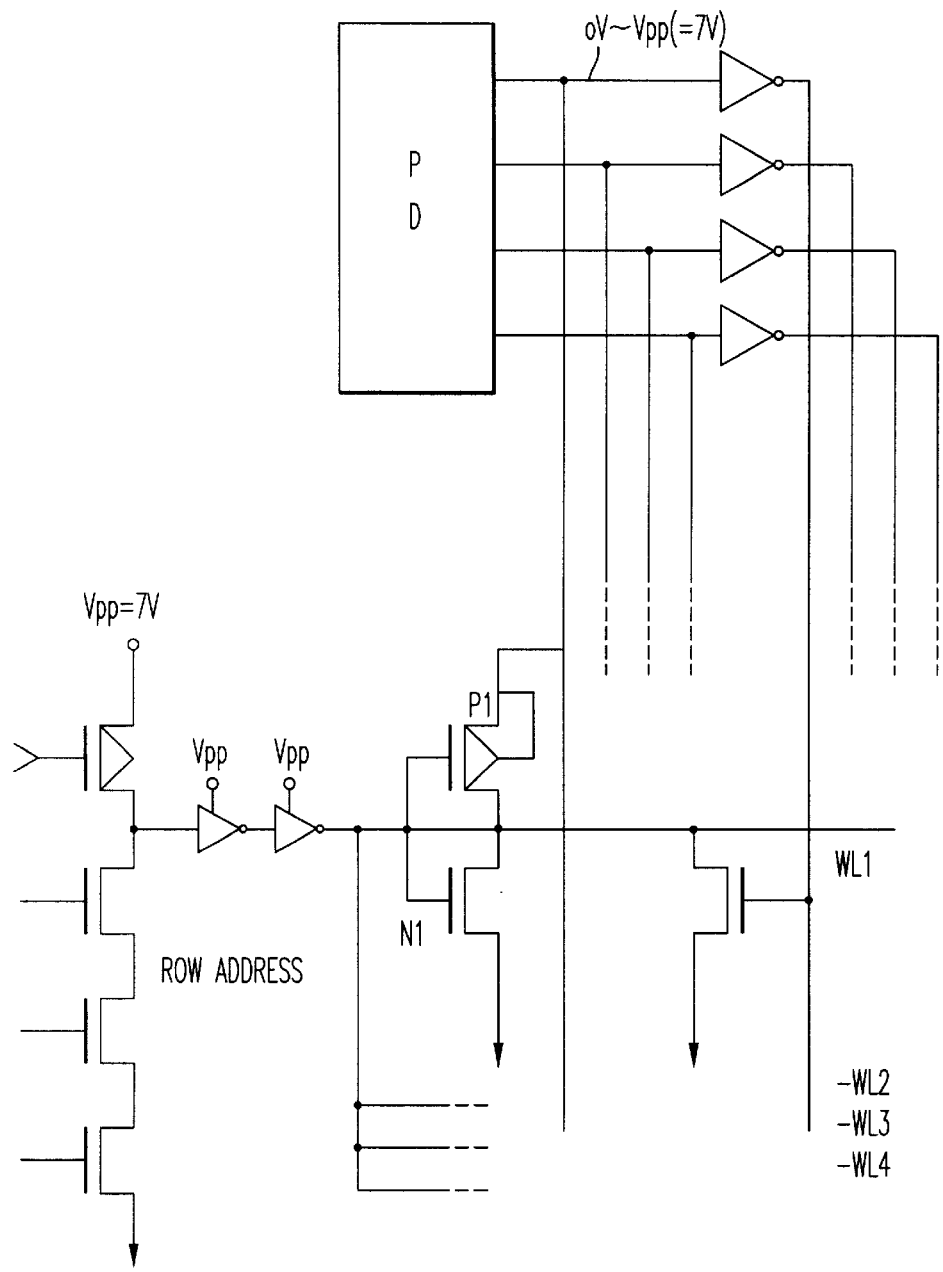
FIG. 25 is a diagram of the row decoder shown in FIG. 22.

FIG. 25 is a detailed circuit diagram of the row decoder 40 shown in FIG. 22. A product of a ratio of a length to a width of a gate of a transistor in row decoder 40 ((W/L)1) and the gate capacitance (C1) of the transistor in memory cell 30, nearly equals a product of a ratio of a length to a width at the transistor within the plate line selector circuit PL 35 to 38 ((W/L)2), and the gate capacitor (C2) in memory cell 30, i.e., (W/L)1·C1~(W/L)2·C2). Owing to the structure described above, the signal rise time can equal the signal fall time.

On the other hand, as shown in FIG. 25, the row decoder 40 is designed in an inverter format, where P channel transistor P1 and N channel transistor N1 are directly connected at the final step. Plate line selector circuits 35 and 36 contain an inverter, wherein P channel transistor P2 and N channel transistor N2 are directly connected at the final step, and are so designed that the product of a ratio of a length to a width at the N channel transistor N1 within the row decoder 40 ((W/L)n1) and gate capacitance (C1) of the memory cell MOS transistor nearly equals the product of a ratio of a length to a width at N channel transistor N2 within the plate line selector circuit (W/L)n2)) and the gate capacitance (C2) of the memory cell 30 transistor (W/L)n1·C1~

(W/L)n2·C2). Also, a product of a ratio of a length to a width of the P channel transistor P1 ((W/L)p1) within the row decoder 40, and gate capacitance (C1) of the transistor of the memory cell nearly equals a product of a ratio of a length to a width at P channel transistor P2 in plate line selector circuits 35 and 36, and the gate capacitance (C2) of the memory cell 30 transistor ((W/Lp1·C1~(W/L)p2·C2).

Meanwhile, in the design, a ratio of the length to the width for the N channel transistor N1 within the row decoder 40 ((W/L)n1) is smaller than a ratio of the length to the width for the P channel transistor P1 within a row decoder 40 ((W/L)p1), i.e., (W/L)n1<W/L)p1. A ratio of the length to the width for N channel transistor N2 ((W/L)n2) within plate line selector circuits 35 and 36 is smaller than a ratio of the length to the width for the P channel transistor P1 within plate line selector circuits 35 and 36, (W/L)n2), i.e., (W/L)n2<(W/L)p2.

Figure 26:
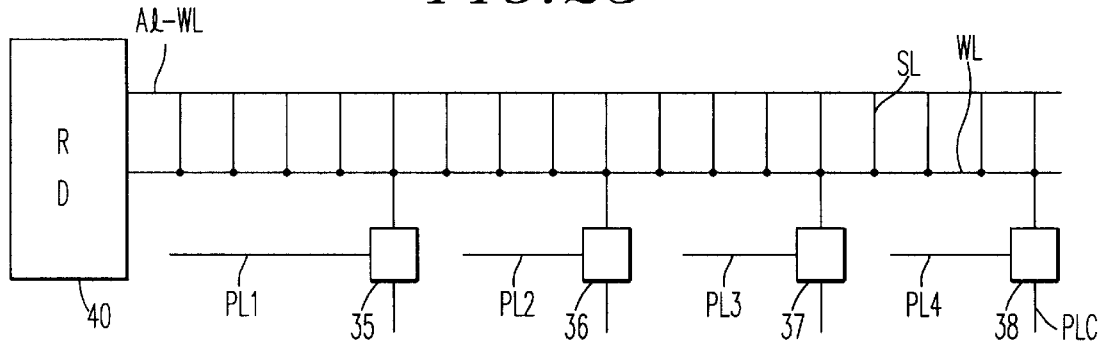
FIG. 26 is a diagram of an arrangement of a word line and a plate line according to the invention.

As shown in FIG. 26, metallic wiring word lines Al–WL are connected with word line WL in shunt. The shunt lines SL are arranged at a regular intervals. In this invention, plate line selector circuits 35, 36, 37, 38, are connected to an end of the shunt lines SL and to plate lines PL1, PL2, . . . . In this embodiment, every fourth one of the shunt lines are connected directly to the plate line selector circuit. Accordingly, the ratio for gate capacitor (C1) of the memory cell transistor and memory cell capacitor (C2) attains 1:4 (C1:C2).

Figure 27:
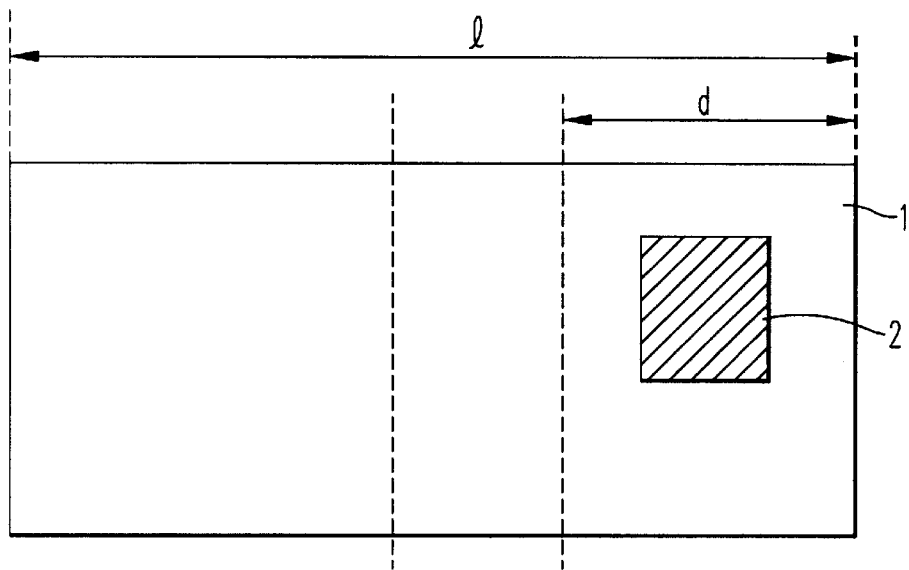
FIG. 27 is a plan view of a card substrate according to the invention.
Figure 28:
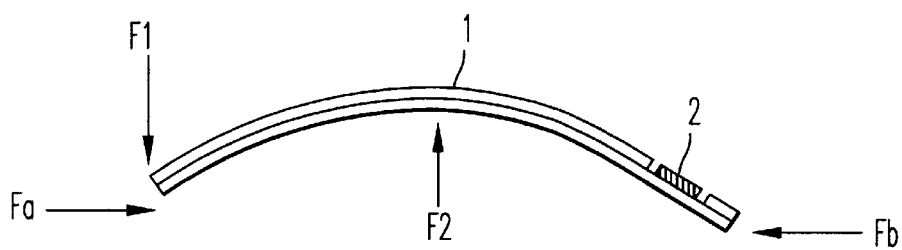
FIG. 28 is a sectional view of the card substrate with applied external physical stress.
Figure 29:
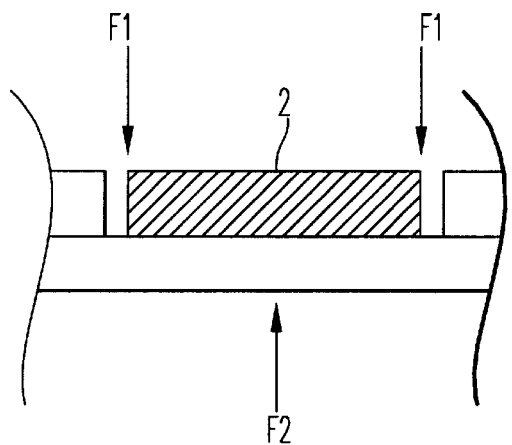
FIG. 29 is an enlarged sectional view of the card substrate of FIG. 28.
Figure 30:
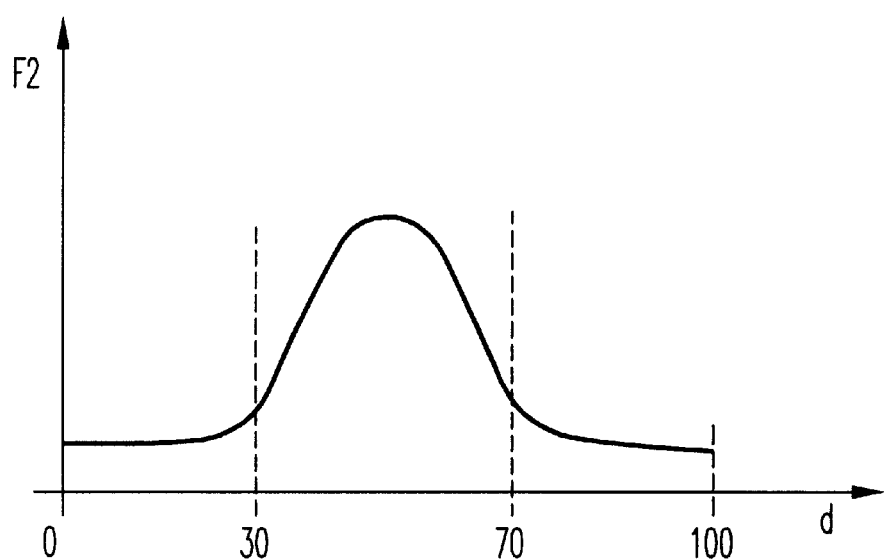
FIG. 30 is a graph of the relation between a distance from the longer edge of the card and an amount of force.

Referring to FIGS. 27–31, the fourth embodiment is described. FIG. 27 shows an example where a non-volatile ferroelectric memory (semiconductor device) 2, using ferroelectric material, is mounted on card substrate 1, consisting of plastic material. The mounting location can be very important. In other words, bowing occurs in the flexible card substrate, when an external physical stress is applied. FIG. 28 shows the bowed condition. It is presumed that forces Fa and Fb are applied along the longer side of card 1. In addition, Fa and Fb have the same magnitude, but their vectors are reversed. As a result, forces F1, F2 and F3 are applied to the card substrate. These partial areas are observed in FIG. 29. The magnitude of F2, as shown in FIGS. 28 and 29, depends on the configuration as shown in FIG. 27 (a distance from the card edge in the longer side direction). In other words, if the card length in the longer side direction is set to 100, the relation between a distance d, from the card edge in the longer side direction counter thereto to the mounting position, and the magnitude of F2, is indicated in FIG. 30.

As shown in FIG. 30, F2 sharply rises at the position where distance d exceeds 30, and falls again at the position where it exceeds 70. The semiconductor chip can be stabilized by means of a metallic plate inserted between the card substrate and the semiconductor device or the chip (non-volatile ferroelectric memory).

Figure 31:
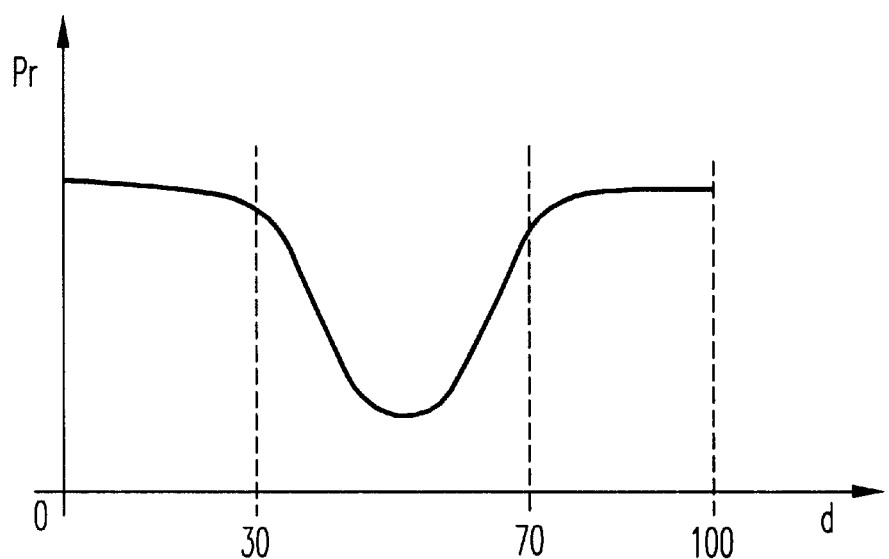
FIG. 31 is a graph of the relation between the distance from an edge of the card and residual polarization.

FIG. 31 shows a relation between distance "d" and residual polarization Pr. In this manner, the residual polarization sharply falls at the position where distance d exceeds 30 from both edges, and rises again at the position where it exceeds 70.

In the case of wider residual polarization Pr, a potential difference between bit lines BLn and $\overline{BLn}$ will increase for read operation, as shown in FIG. 18. Then, a lower potential amplitude level can be achieved due to the sense amplifier. Therefore, total power consumption throughout semiconductor devices will be decreased.

As mentioned above, it is understood that positions, where the non-volatile memory (semiconductor device) using the card ferroelectric material may be mounted, should be located within 30 percent of the distance from flexible card edges. Further, it is recommended, for a rectangular card, that the position be located, not within 30 percent of the distance from the longer side, but within 30 percent of the distance from the short side. Card users are apt to apply a force in the longer side direction. If a receiver antenna is mounted on this card, which is connected to this semiconductor device or chip, the transponder will be formed as shown in FIG. 46.

Figure 32:
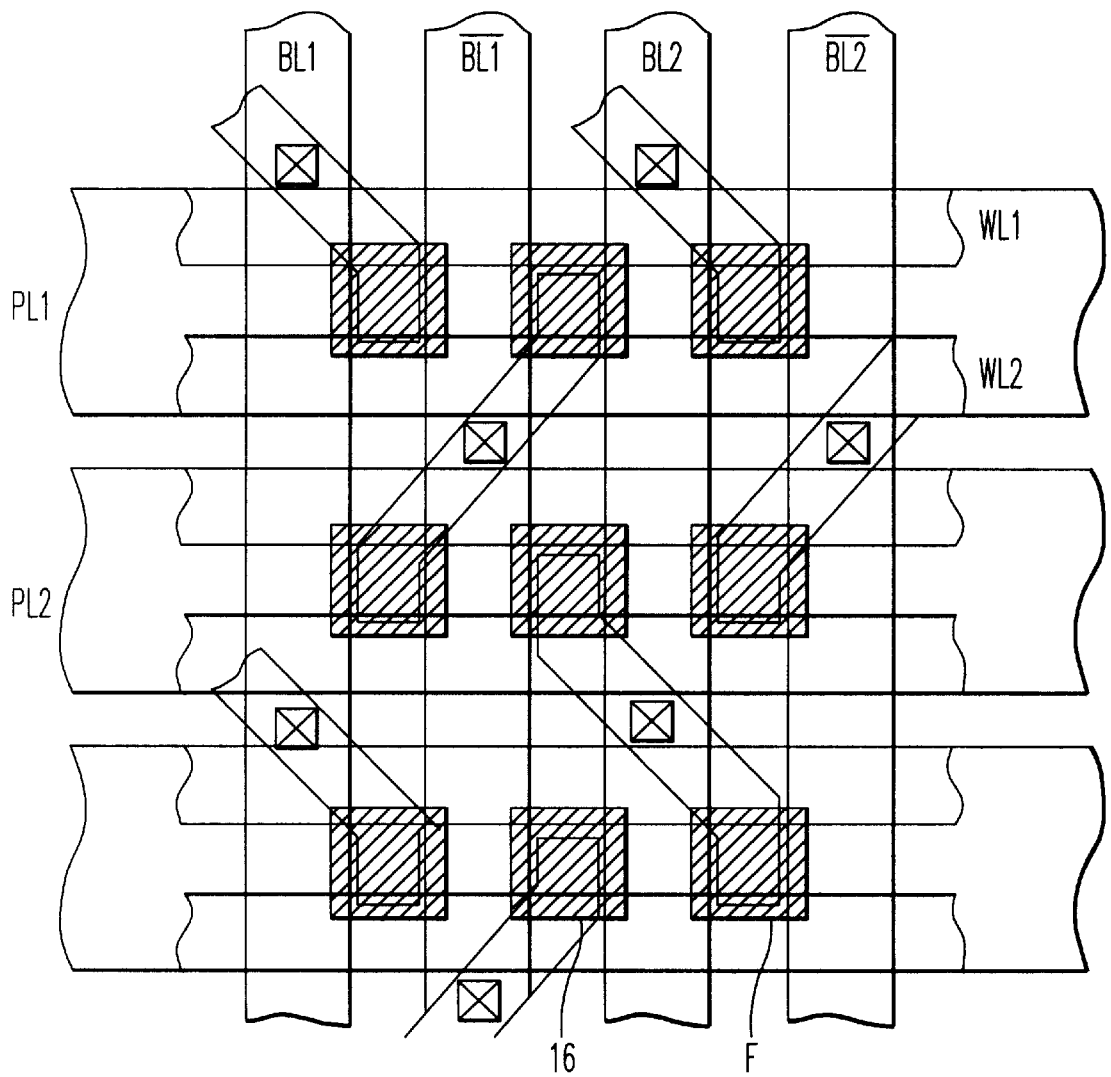
FIG. 32 is a plan view showing a part of an FRAM cell array according to the invention.

A fifth embodiment will now be described, referring to FIGS. 32 and 34. As described above, an external force, such as F2, when applied to a card substrate acts on memory cells formed on semiconductor devices mounted on the card (see FIGS. 27 and 29). FIG. 32 is a simple plane view for the non-volatile ferroelectric memory (semiconductor or chip) mounted on the transponder. Plural memory cells are arranged on this semiconductor device in the format of a memory cell array, like a matrix. FIG. 32 shows a part of memory cell array. The memory cell is equipped with capacitors containing a ferroelectric layer, consisting of the MOS transistor and PZT containing gate 20, as shown in FIG. 4. This embodiment is characterized in the format of the capacitor ferroelectric layer. As shaded in FIG. 32, capacitor ferroelectric layer F has a square format. Also in this embodiment, a cell may be composed of two transistors and two capacitors (2T/2C). However, a one transistor and one capacitor cell (1T/1C) may be allowed. The invention is, however, not limited to this embodiment.

Provided that an external force is applied to the card substrate, stress, which is applied to ferroelectric layer F, formed in the semiconductor devices mounted on the card, is proportional to the length thereof. Ferroelectric layer F is shown formed in a square format. However, it should be noted that a rectangular format can withstand higher stress than the square format. A level of stress, which is applied to this ferroelectric layer, will have effects on the hysteresis property. Therefore, if a strong ferroelectric layer is used for such stress, a memory card with a high data holding property can be produced.

Card substrate 1, as shown in FIG. 27, has a roughly rectangular plastic elasticity. In this embodiment, semiconductor device 2, formed on the semiconductor substrate, also has a roughly rectangular format. Further, semiconductor device 2 is mounted parallel to the short side on card substrate 1. In this arrangement, much stress is applied to the semiconductor device. In addition, semiconductor device 2 may be mounted by means of a metallic plate, or directly on the card substrate 1. The former material can secure higher reliability, and the latter material can realize low cost and the thinnest cards. In particular, the latter is not realized until the mechanism of this embodiment is utilized.

Figure 33A:
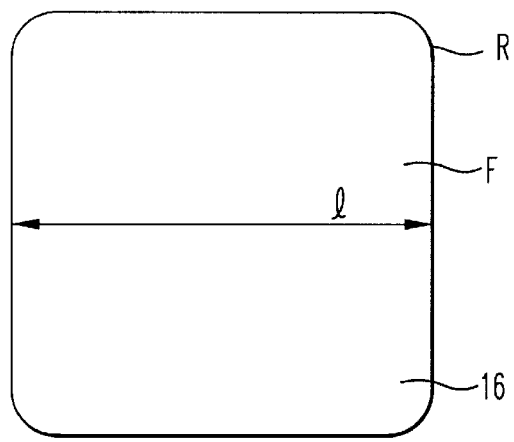
FIGS. 33(a) and 33(b) are plan views of a ferroelectric film according to the invention.
Figure 33B:
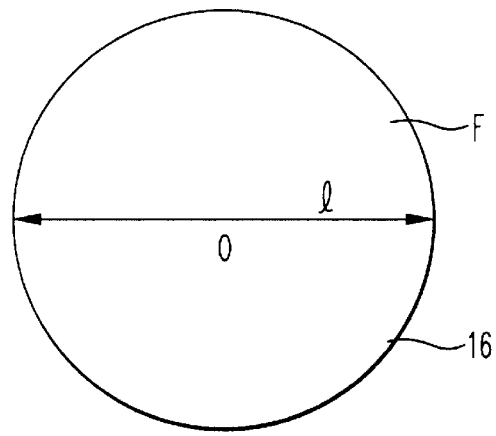

FIGS. 33(a) and 33(b) are a plane views showing other formats for the capacitor ferroelectric layer. The square format (FIG. 33(a)), found on the ferroelectric layer, is strongly resistant to the stress. However, a format with rounded corners or circular format is provided (FIG. 33(b)). The rounded body curvature radius R is applied at each corner of the square. Stress, which is applied to the ferroelectric layer according to this curvature radius R size, will change.

Figure 34:
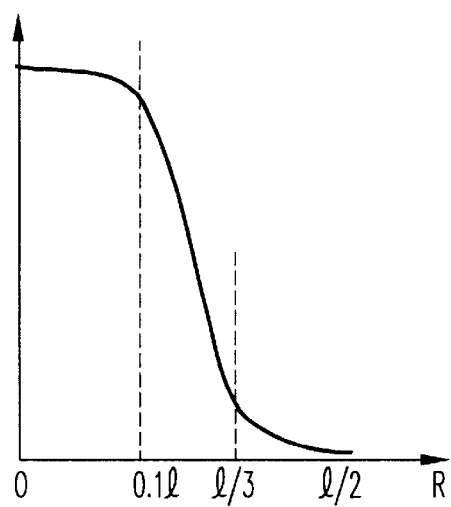
FIG. 34 is a diagram indicating the dependence of stress on the radius of curvature.

FIG. 34 is a diagram indicating the curvature radius R dependence of stress (F2). If either side of the square is set to L, the stress value is almost constant at R, up to 0.1R, the stress sharply lowers approximately to 0.2R~0.3R, and if the value reaches 5R, the stress approaches a minimum value.

Using the ferroelectric layer with a strong format, as mentioned above, a memory card with high data holding property provided for the transponder, as shown in FIG. 46, can be obtained. Also, total power consumption throughout the semiconductor devices can be reduced in the same manner as in the fourth embodiment.

A sixth embodiment is described referring to FIGS. 35 and 36. FIGS. 35(a) and 35(b) are respective plan and sectional views of a memory card, which contains a non-volatile ferroelectric memory (semiconductor device or chip 2), equipped with a ferroelectric memory cell mounted on the transponder. Card substrate 1, shown in FIG. 35(a), consists of a nearly rectangular plastic elasticity body with long side A and short side B. Semiconductor substrate 2, where the semiconductor device is formed, is nearly a rectangle with long side a and short side b. Semiconductor device 2 is mounted with side a parallel to short side B.

Semiconductor device 2 is mounted directly to or by means of metallic plate 3 (this embodiment uses metallic plate 3) to card substrate 1. The former method will achieve higher reliability, and the latter method achieves a lower cost and a super-thin card. Particularly, the latter method can first be accomplished after the configuration for this embodiment is utilized. Besides, total power consumption throughout the semiconductor devices can be reduced, similarly to the fourth embodiment.

The magnitude of the external force F2 not only depends on the mounting direction for semiconductor device 2, but also the strength for semiconductor device card substrate 1 depends on the long side direction. A silicon substrate (chip), where semiconductor device 2 is formed, is approximately a rectangle. If the long side a is arranged in parallel with short side B of the card, as shown in FIG. 35, external force F2 will decrease. If it is arranged vertically, as shown in FIG. 36, external force F2 increases. Therefore, the arrangement of FIG. 36(b) is less advantageous.

As described above, the strength of external force F2 will have an influence on ferroelectric layer hysteresis property. Accordingly, a semiconductor device should be mounted as shown in FIG. 35, not as in FIG. 36, in order to obtain a memory card having a high data holding property, which is to be provided such as for use in a transponder.

FIGS. 37–41 illustrate a seventh embodiment according to the present invention. FIG. 37(a) shows a non-volatile ferroelectric memory (semiconductor device), wherein circuits necessary for the RFID system are mounted on a single chip. FIG. 37(b) is an example of a transponder where the semiconductor device is mounted on a card substrate made of plastic that is used for the RFID system. As shown in FIG. 37(b), a single chip type consolidated non-volatile ferroelectric memory (semiconductor device) 60 is mounted on either end of plastic card substrate 69. Transmit/receive antennas 88 having a loop shape are formed on card substrate 69.

Figure 37A:
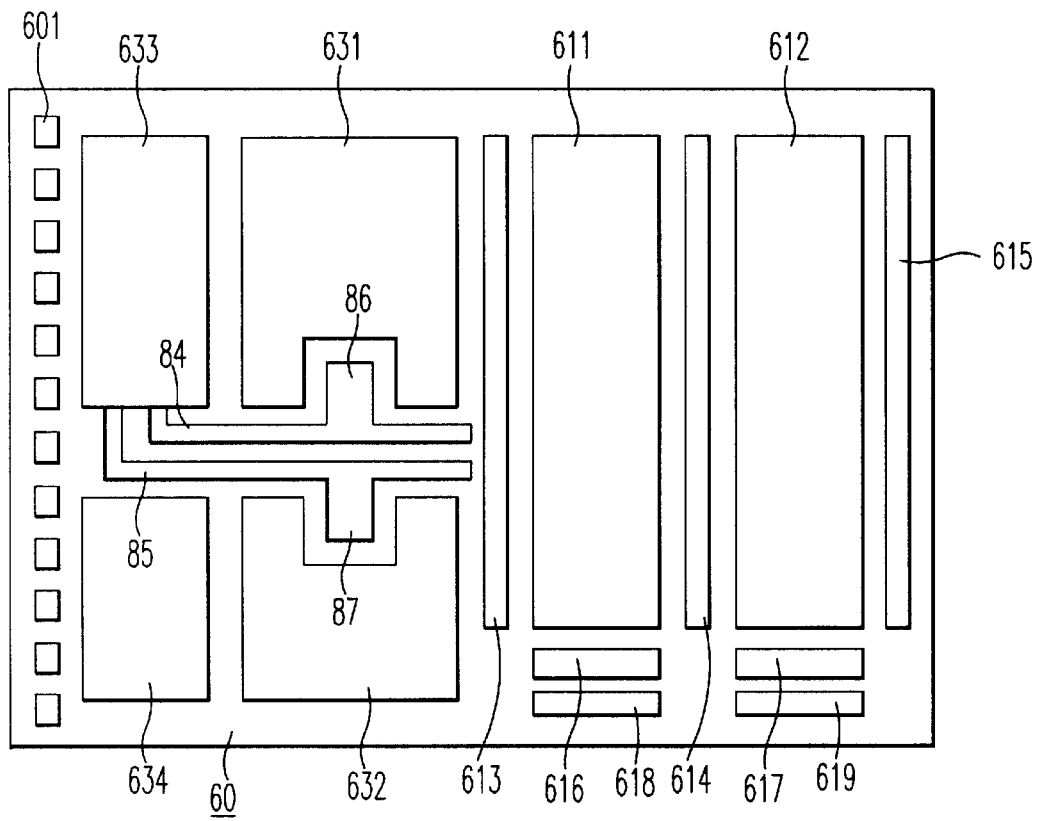
FIGS. 37(a) and 37(b) show plan views of a card loaded RFID system.
Figure 37B:
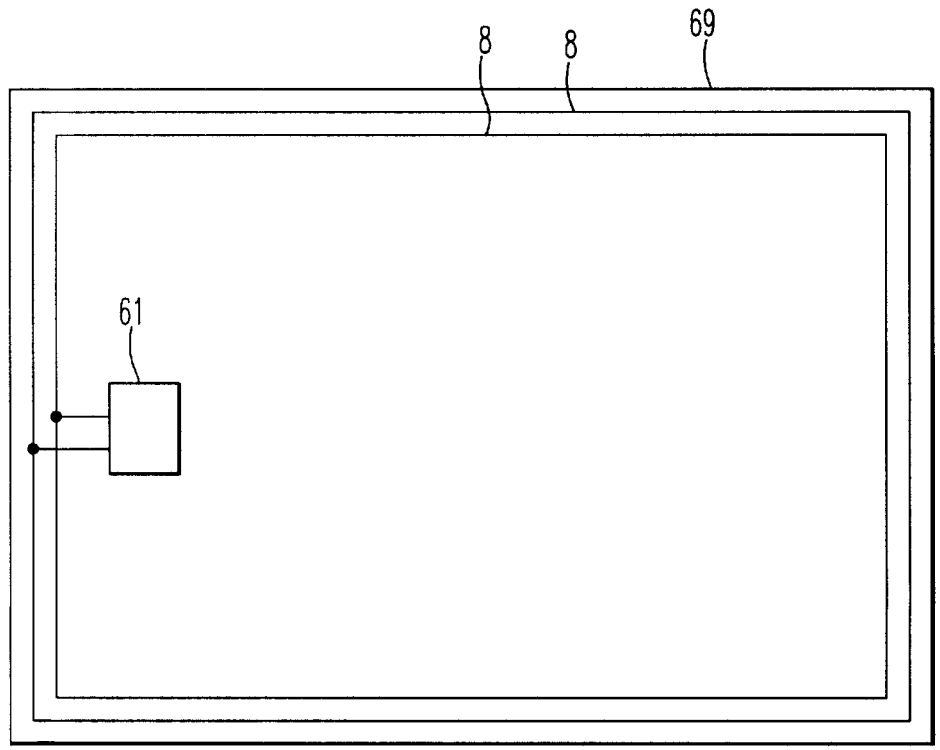

Semiconductor device 60 has a structure, as shown in FIG. 37(a), wherein input/output pads 601 are arranged in a row on an end of the semiconductor device (preferably on the short side). Rectifier circuit 633 and detector/transmitter circuit 634 are arranged in the vicinity of input/output pads 601. Rectifier circuit 633 generates DC 5 V from the carrier wave of input signals by, for example, a diode bridge circuit, etc. Detector/transmitter circuit 634 receives information from the outside by detecting signals received by antenna 88, for example, with a heterodyne system, if they are AM modulated, or with a PLL system if they are FM modulated. Conversely, detector/transmitter circuit 634 transmits information to the outside using antenna 88.

The non-volatile ferroelectric memory is arranged on the other end of the semiconductor device (opposite to the rectification circuit 63). Such an arrangement can effectively disperse heat generated in the rectifier circuit. The non-volatile memory may also comprise non-volatile memory arrays 611 and 612, row decode circuit 614, plate decode/drive circuits 613 and 615, sense amplifier arrays 616 and 617, and column select circuits 618 and 619.

Various control and calculation circuits 631 and 632 are located between a memory cell and a power system circuit (i.e., rectification circuit 633). It is preferable that these calculation circuits have ASIC standard cell structure both for reducing the time required to design them and for discharging heat effectively.

Power lines are provided between the memory cell portion (FRAM cell portion) and a power system circuit for a non-volatile ferroelectric memory, and supply a DC voltage generated at the power system circuit to the non-volatile ferroelectric memory cell.

The power line comprises Vcc (high potential side) power line 84 and Vss (low potential side) power line 85. The potential difference between the two lines is normally 5 V. Heat accumulation means 86 and 87, characterized in the present invention, are arranged in the center between the power lines. These heat accumulation means 86 and 87 (hereinafter called covers) are projections, which are made of the same materials (aluminum is preferable) as those provided for the power lines.

Figure 38:
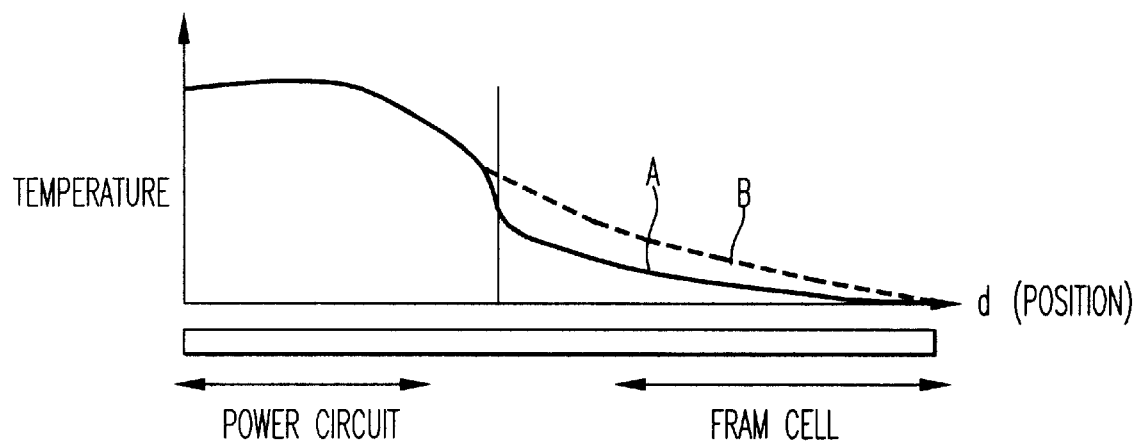
FIG. 38 is a graph indicating thermal variation along the card.

FIG. 38 is a characteristic diagram explaining the effect brought forth by providing the covers 86, 87. As shown in FIG. 38, the vertical axis indicates temperature, the horizontal axis indicates the position (d) on a semiconductor device of a power system circuit such as a rectifier circuit and an FRAM portion. FIG. 38 shows the temperature dispersion state on a semiconductor device. Without covers (curve B indicated with a dotted line), heat is directly without any obstacle transferred from the power system circuit portion, which tends to be relatively high temperature, to the FRAM cell portion, thereby increasing the temperature of the memory cell. It may cause deterioration in a data holding property, as described above. Dotted curve B shows a temperature distribution in this case, and solid curve A shows temperature distribution when covers are provided. This embodiment preferably uses aluminum wires for Vcc/Vss having a 1.1 µm thickness and a 10 µm width, respectively, and a 150×900 µm rectangular cover. The reason why thermal conductivity rapidly changes, when covers are provided, is that power lines play an important role in thermal conductivity.

According to the embodiment, removing heat generated from the power lines can prevent the ferroelectric layer data holding property from deteriorating. In addition, this largely contributes to the reduction in power consumption by all the semiconductor devices, in the same manner as the fourth embodiment.

Figure 39:
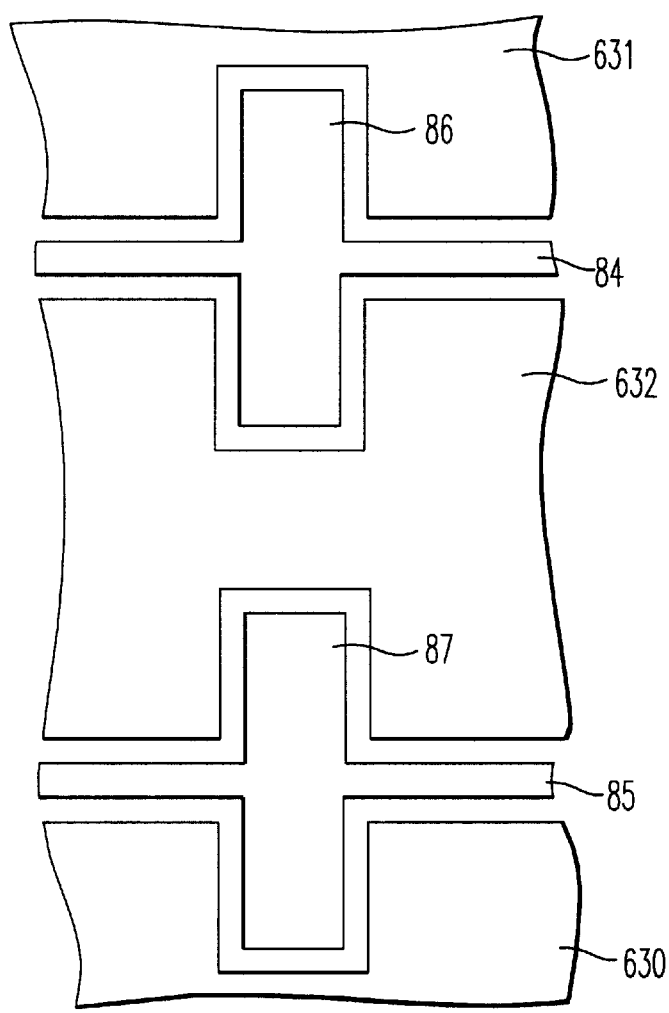
FIG. 39 is a plan view of an arrangement of a heat accumulation means in a semiconductor device.

FIG. 39 shows another example of covers 85 and 86. The same numbers are given to such as power lines and covers as in the above description. 630 shows an operation circuit and a control circuit. Covers are spread right and left, by keeping a certain space between Vcc line and Vss line, so that effective thermal shielding can be achieved.

Figure 40:
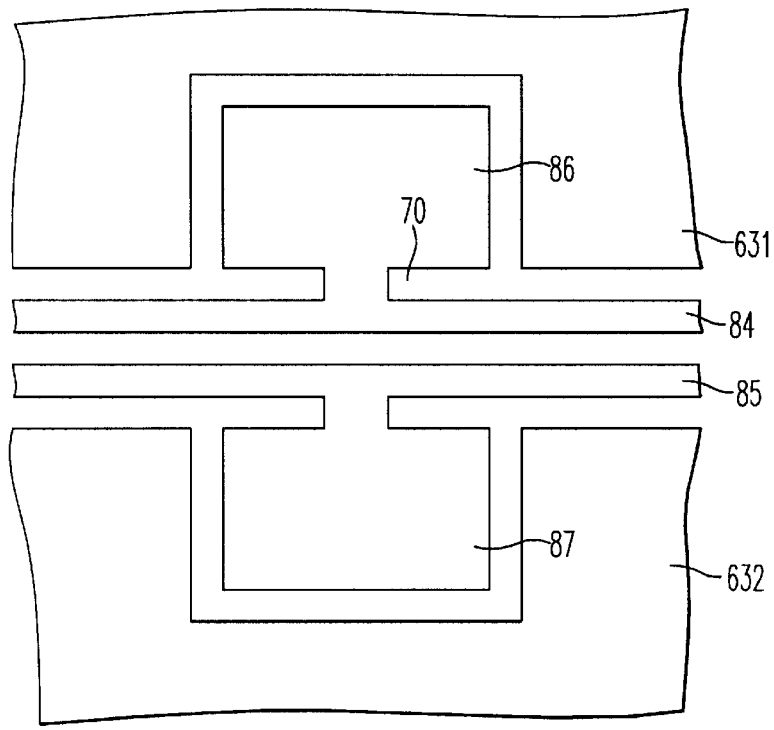
FIG. 40 is plan view of another arrangement of a heat accumulation means in a semiconductor device.

FIG. 40 shows an example where a narrow portion 70 is provided between covers 86/87 and power lines 84/85. The same symbols are given to such as power lines and covers, as described above. Normally, the power circuit for unpowered ID equipment operates for only a short time (1 sec or less). However, it will take exceptionally more seconds for operation when a huge amount of data processing is needed.

In this case, the heat shielding capacitance for a cover should be prevented from saturating immediately. Thus, a configuration shown in FIG. 40 is preferred for an unpowered ID that is required to operate for long time.

Figure 41A:
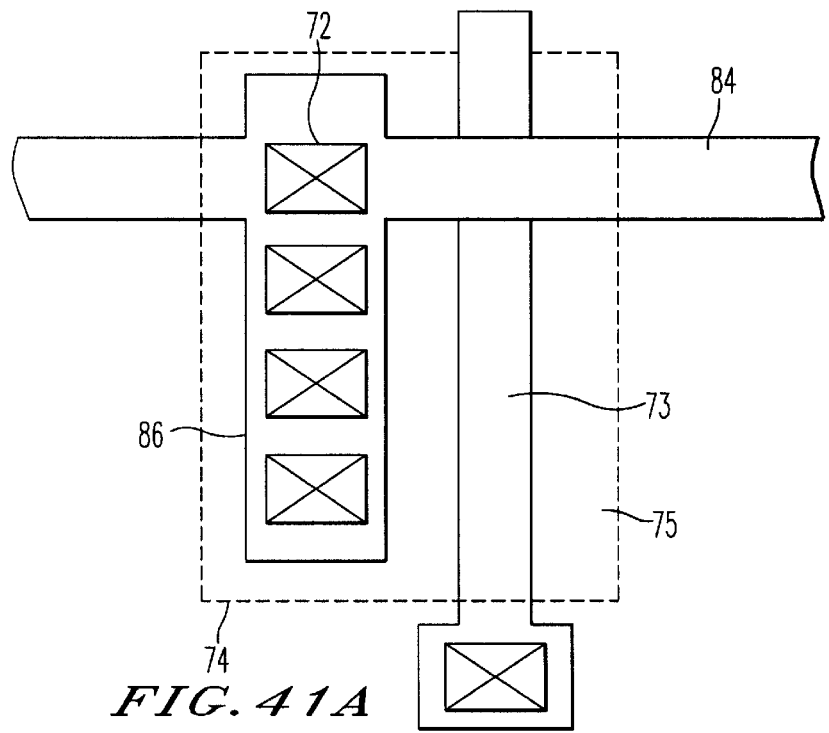
FIGS. 41(a) and 41(b) are a plan view of an arrangement of a heat accumulation means in a semiconductor device and a diagram of an equivalent circuit, respectively.
Figure 41B:
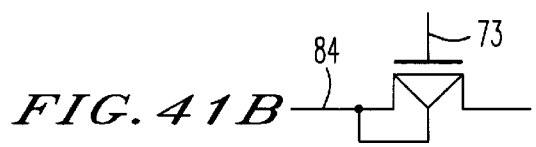

FIG. 41(a) is an example where a cover is used in common with a contact portion to supply power to a control circuit or other transistors. That is, power line 84 is equipped with cover 86, where contact hole 72 is equipped for supplying source power to the transistors (source 74, drain 75, gate 73) located thereunder. FIG. 41(b) shows the equivalent circuit. In such a configuration, chip area reduction can be achieved.

Figures 42, 43:
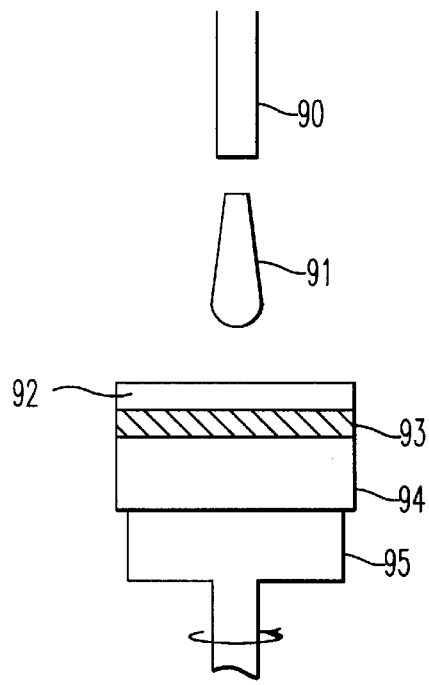
FIG. 42 is a table indicating properties of ferroelectric films.
FIG. 43 is a diagram for illustrating a step of manufacturing a ferroelectric film according to the invention.

The above embodiment describes an example where the PZT ferroelectric layer is used, but the present invention is not limited to this layer. As shown in FIG. 42, for example, the present invention may also include a BaTiO$_3$ (BTO) layer and so on. In addition, the present invention is, of course, applicable to a PLZT layer, an LiNbO$_3$, and a K$_3$Li$_2$Nb$_5$O$_{15}$ layer.

Next, referring to FIGS. 43 and 45, manufacturing processes for a thin ferroelectric layer will be explained. For example, the sol-gel method, sputter method or MOCVD method are usually used for manufacturing the thin ferroelectric layer. In combination with this invention, the sol-gel method or the sputter method can provide a more significant effect.

The sol-gel method or the MOCVD method provides a thin ferroelectric layer, which is produced by coating a solution, made of organic metal compounds as source material, onto a substrate, using either dipping or spin-coating, and by performing thermal decomposition of the material. These methods allow layers to be formed in air, as well as to greatly increase the area of the layers. One example is shown in FIG. 43. A nozzle 90 sprays a solution 91, as described above, onto an electrode 93 formed on a substrate 94 to produce the ferroelectric layer 92. The substrate is mounted on a turntable 95 which spins the substrate to obtain a desired thickness and uniformity of layer 92.

Figure 44:
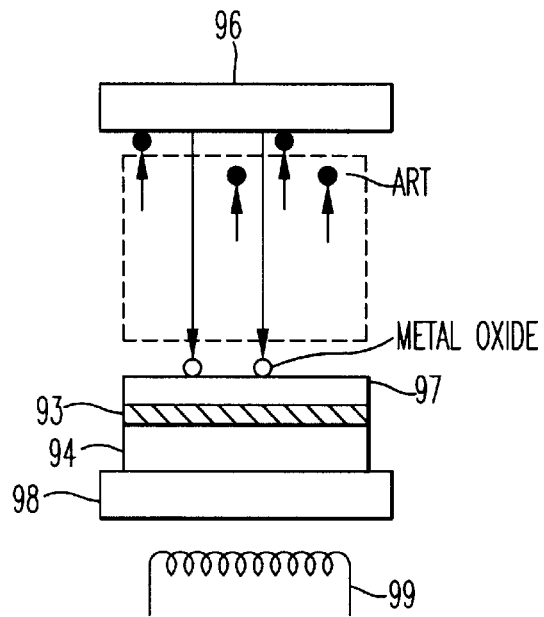
FIG. 44 is a diagram for illustrating a step of manufacturing a ferroelectric film according to the invention.

The sputter method, illustrated in FIG. 44, forms a ferroelectric layer 99 by stacking particles 97 onto a substrate 94 which may have an electrode 93. The substrate is typically mounted on a holder that may be heated by coil 99. These particles are subsequently sputtered by colliding gas, which is ionized during glow discharging (for example, Ar gas), with the target material 96, which would be a thin layer. This method enables forming layers of high melting point materials, which are difficult to produce in a vacuum evaporation method. This layer formation method is represented with DC, RF, magnetron, ion beam, reactive sputters, and laser abrasion.

The sputter method employs sintered material or powder as a target, which is then sputtered in an argon and oxygen atmosphere at approximately 2–300° C. If a magnet is placed in the neighborhood of a target, the sputtered ion cloud is restrained by the magnetic field. This enables sputtering at low gas pressure (~10$^{-4}$ Torr), and accelerates the layer growth rate. The fine structure and properties of a ferroelectric layer depend on sputter conditions (sputter voltage, gas composition and gas pressure, layer formation rate, substrate materials, substrate temperature, etc.).

Figure 45:
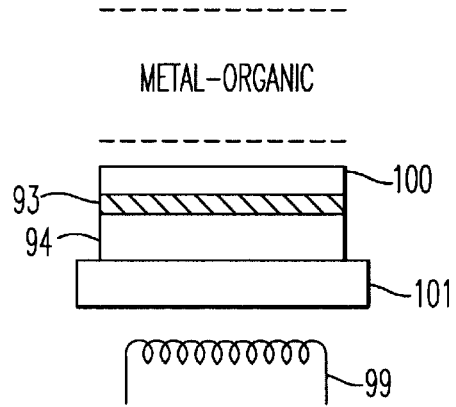
FIG. 45 is a diagram for illustrating a step of manufacturing a ferroelectric film according to the invention.

The basic method for performing CVD is to introduce a target compound among element compounds for layer formation, which would be gaseous, into a high temperature furnace, and depositing it on the substrate surface and forming layers, and is illustrated in FIG. 45. A layer 100 is formed on substrate 94 which may have an electrode 93 formed thereon. The substrate 94 is typically mounted on susceptor 101 which also may be heated. Thus, layers are formed on the substrate surface in a balanced state, so that more homogeneous crystal layers can be obtained. In MOCVD, typically performed at 600° C. or less, ferroelectric layers are formed from organic metal used as raw material, such as acetyl acetonate or alkoxide.

The preceding embodiments present invention may be modified. For example, the present invention can be applied not only to the case when a ferroelectric memory cell is formed on a semiconductor substrate, as described above, but also in the case when a ferroelectric memory cell is formed on a semiconductor layer on an insulation substrate, such as SOI.

The present invention also has several advantages, apparent from the above embodiments. First, the non-volatile ferroelectric memory mounted on a transponder, according to the present invention, has the configuration stated above, which can reduce the memory plate line CR (capacitance/resistance), and prevent any malfunction possibility.

Furthermore, the present invention has a configuration wherein; a non-volatile ferroelectric memory plate line, using a ferroelectric layer for a capacitor, is divided into plural portions in the row direction; and by shifting the drive timing for divided plate lines, until the timing is shifted for the individual drive configurations, a maximum transient flow current rate can be reduced.

The present invention can also decrease chip area, while lowering the resistance of word line resistance, because a plate line driver circuit, equipped for the divided plate lines, is arranged within a shunt region.

Further, in the present invention, physical stress applied to the ferroelectric layer is weakened. As a result, deterioration in the polarization retention property for a ferroelectric layer can be controlled, so that the data holding property of the ferroelectric layer memory data cannot be deteriorated.

Furthermore, in the present invention, thermal stress applied to the ferroelectric layer is weakened. As a result, deterioration in the polarization retention property for a ferroelectric layer can be controlled. In the case when a ferroelectric layer according to the invention is used for a non-volatile ferroelectric memory, or in the case when it is used for an ID card, the data holding property cannot be deteriorated.

While there has been illustrated and described what are presently considered to be preferred embodiments of the present invention, it will be understood by those skilled in the art that various changes and modifications may be made, and equivalents may be substituted for devices thereof without departing from the true scope of the invention. In addition, many modifications may be made to adapt a particular situation or material to the teaching of the present invention without departing from the central scope thereof. Therefore, it is intended that this invention not be limited to the particular embodiment disclosed as the best mode contemplated for carrying out this invention, but that this invention include all embodiments falling within the scope of the appended claims.

What is claimed as new and desired to be secured by Letters Patent of the United States:

1. A ferroelectric memory comprising:
   a memory cell composed by a MOSFET and a ferroelectric capacitor;
   a word line connected to said memory cell;
   a plate line connected to said memory cell;

a row decoder having a first inverter, whose output is coupled to said word line; and a plate line select circuit having a second inverter and an output coupled to said plate line;

wherein one of:

a capacitance of said MOSFET is smaller than a capacitance of said capacitor;

a first product of a ratio of a length to a width of a gate in an NMOS transistor included in said first inverter and a gate capacitance of the MOSFET is approximately equal to a second product of a ratio of a length to a width of a gate in an NMOS transistor included in said second inverter and a capacitance of said capacitor; and a third product of a ratio of a length to a width of a gate in a PMOS transistor included in said first inverter and a gate capacitance of the MOSFET is approximately equal to a fourth product of a ratio of a length to a width of a gate in a PMOS transistor included in said second inverter and a capacitance of said capacitor.

2. The ferroelectric memory according to claim 1, wherein said plate line select circuit comprises a NAND circuit and an inverter circuit.

3. The ferroelectric memory according to claim 2, comprising a second plate line select circuit, wherein said second plate line select circuit is coupled to one of input of said NAND circuit.

4. The ferroelectric memory according to claim 1, further comprising:

a control line coupled to the plate line select circuit, arranged in a column direction; and a driving circuit coupled to the control line.

5. A ferroelectric memory comprising:

a row decoder having a first inverter, whose output is coupled to a word line; and a plate line select circuit having a second inverter, whose output is coupled to a plate line;

wherein one of:

a first ratio of a length to a width of a gate in an NMOS transistor included in said first inverter is smaller than a second ratio of a length to a width of a gate in a PMOS transistor included in said first inverter; and a third ratio of a length to a width of a gate in a NMOS transistor included in said second inverter is smaller than a fourth ratio of a length to a width of a gate in a PMOS transistor included in said second inverter.

6. The ferroelectric memory according to claim 5, wherein the plate line select circuit comprises a NAND circuit and an inverter circuit.

7. The ferroelectric memory according to claim 6, comprising a second plate line select circuit, wherein said second plate line select circuit is coupled to one of input of said NAND circuit.

8. The ferroelectric memory according to claim 5, further comprising:

a control line coupled to the plate line select circuit, arranged in a column direction; and a driving circuit coupled to the control line.

9. A ferroelectric memory, comprising:

a plurality of memory cells;

word lines coupled to said memory cells;

a plurality of plate lines configured in association with said word line and each coupled to respective of said memory cells; and plate line select circuits coupled to said plate lines, wherein said plate line select circuit comprises three coupled circuits each having a NAND circuit coupled to an inverter circuit, a first one of the coupled circuits having as input a signal from said word line and a delay signal, and second and third ones of said coupled circuits each having as input an output of the first coupled circuit and an address signal and each outputting a control signal to one of said plate lines.

10. A ferroelectric memory comprising:

first and second memory cell arrays, each arranged in a predetermined direction;

a row detector arranged in said predetermined direction;

a word line coupled to said row decoder and being shared by said first and second memory cell arrays;

a plate line select circuit arranged between said first memory cell array and said second memory cell array; and plurality of plate lines coupled to said plate line select circuit in association with the word line and coupled to respective of said memory cell arrays.

11. The ferroelectric memory according to claim 10, further comprising:

a driver circuit;

a plate line control line coupled to said driver circuit and an inputted to said plate line select circuit; and a delay line coupled to said driver circuit.

12. The ferroelectric memory according to claim 10, comprising:

said plate select circuit providing a first signal to one of said plate lines, shifted in time with respect to another signal provided to another one of said plate lines.

13. The ferroelectric memory comprising a first memory cell array;

a second memory cell array;

a row decoder paralleled to said second memory cell array;

a word line formed in said first memory cell array and said second memory cell array in common, and coupled to said row decoder;

a plate line select circuit arranged between said first memory cell array and said second memory cell array;

a first plate line formed in said first memory cell array in association with said word line, and coupled to said plate line select circuit and said first memory cell array; and a second plate line formed in said second memory cell array, and coupled to said plate line select circuit and said second memory cell.

14. The ferroelectric memory according to claim 13, further comprising:

a driver circuit;

a plate line control line coupled to said driver circuit and an inputted to said plate line select circuit; and a delay line coupled to said driver circuit.

15. The ferroelectric memory according to claim 13, comprising:

said plate line select circuit providing a first signal to one of said first plate line and said second plate line, shifted in time with respect to another signal provided to another one of said first plate line and said second plate line.

16. A ferroelectric memory comprising:
a first memory cell array;
a second memory cell array;
a third memory cell array;
a fourth memory cell array;
a row decoder paralleled to said second memory cell array, and said third memory cell array;
a word line formed in said first memory cell array, said second memory cell array, said third memory cell array, and fourth memory cell array in common, and coupled to said row decoder;
a first plate line select circuit arranged between said first memory cell array and said second memory cell array;
a second plate line select circuit arranged between said third memory cell array and said fourth memory cell array;
a first plate line formed in said first memory cell array in association with said word line, and coupled to said first plate line select circuit;
a second plate line formed in said second memory cell array in association with said word line, and coupled to said first plate line select circuit;
third plate line formed in said third memory cell array in association with said word line, and coupled to said second plate line select circuit; and
a fourth plate line formed in said fourth memory cell array in association with said word line, and coupled to said second plate lien select circuit.

17. A ferroelectric memory comprising:
a first memory cell array including a first sense amplifier;
a second memory cell array including a second sense amplifier;
a word line formed in common in said first memory cell array and said second memory cell array;
a row decoder coupled to said word line;
a first plate line formed in said first memory cell array in association with said word line;
a second plate line formed in said second memory cell array in association with said word line;
a first plate lines select circuit coupled to said first plate line, and comprising a NAND circuit and an inverter circuit coupled in this order;
a second plate line select circuit coupled to said second plate line, and comprise a NAND circuit and an inverter circuit coupled in this order;
a first plate line driver circuit coupled to said first plate line select circuit; and
a second plate line driver circuit coupled to said second plate line select circuit.

18. A semiconductor chip comprising:
a ferroelectric memory located in one side of the semiconductor chip;
a power supply circuit located in another side of the semiconductor chip;
a control circuit and an operational circuit located between the ferroelectric memory and the power supply circuit;
a power supply line through the control circuit and the operational circuit, coupled to the power supply circuit; and
a heat storage means formed in the power supply line.

19. The semiconductor chip according to claim 18, wherein said heat storage means is located approximately mid-way between said power supply circuit and said memory.

20. The semiconductor chip according to claim 19, wherein said power supply line comprises a narrow portion formed between the control circuit and the heat storage means.

21. A semiconductor chip comprising:
a ferroelectric memory located in one side of the semiconductor chip;
a power supply circuit located in another side of the semiconductor chip;
a control circuit and an operational circuit located between the ferroelectric memory and the power supply circuit;
power supply line through the control circuit and the operational circuit, coupled to the power supply circuit; and
a heat storage means formed in the power supply line including a contact hole supplying source power to a transistor located thereunder.

22. The semiconductor chip according to claim 21, wherein said heat storage means is located approximately mid-way between said power supply circuit and said memory.

* * * * *